(12) United States Patent
Shirasaka

(10) Patent No.: US 7,524,696 B2
(45) Date of Patent: Apr. 28, 2009

(54) SENSOR INCLUDING LEAD FRAME AND METHOD OF FORMING SENSOR INCLUDING LEAD FRAME

(75) Inventor: Kenichi Shirasaka, Hamamatsu (JP)

(73) Assignee: Yamaha Corporation, Shizuoka-Ken (JP)

(*) Notice: Subject to any disclaimer, the term of this patent is extended or adjusted under 35 U.S.C. 154(b) by 228 days.

(21) Appl. No.: 11/360,231

(22) Filed: Feb. 23, 2006

(65) Prior Publication Data

US 2006/0194362 A1    Aug. 31, 2006

(30) Foreign Application Priority Data

Feb. 25, 2005  (JP)  ............... P2005-050879
Mar. 29, 2005  (JP)  ............... P2005-093636

(51) Int. Cl.
*H01L 21/00* (2006.01)

(52) U.S. Cl. ............... 438/64; 438/106; 438/123; 257/666; 257/676; 361/807; 361/813

(58) Field of Classification Search ............... 438/64; 29/827, 854, 857; 361/807, 813; 257/421
See application file for complete search history.

(56) References Cited

U.S. PATENT DOCUMENTS

| 6,212,783 | B1 | 4/2001 | Ott et al. | |
| 7,187,063 | B2 | 3/2007 | Adachi et al. | |
| 2004/0009629 | A1* | 1/2004 | Ahn et al. | 438/108 |
| 2004/0103530 | A1* | 6/2004 | Adachi et al. | 29/854 |
| 2005/0029640 | A1* | 2/2005 | Amano et al. | 257/678 |
| 2005/0042868 | A1* | 2/2005 | Matsuo et al. | 438/687 |

FOREIGN PATENT DOCUMENTS

| EP | 0 481 806 | 10/1991 |
| JP | 05-291482 | 11/1993 |
| JP | 06-265569 | 9/1994 |
| JP | 07-225241 | 8/1995 |
| JP | 07-225242 | 8/1995 |
| JP | 07-273353 | 10/1995 |
| JP | 09-236616 | 9/1997 |
| JP | 09-292408 | 11/1997 |
| JP | 11-281666 | 10/1999 |
| JP | 2001-189402 | 7/2001 |
| JP | 2001-356154 | 12/2001 |
| JP | 2002-015204 | 1/2002 |
| JP | 2004-006752 | 1/2004 |
| JP | 2004-077374 | 3/2004 |
| JP | 2004-128473 | 4/2004 |

* cited by examiner

*Primary Examiner*—Thao X Le
*Assistant Examiner*—Eric W Jones
(74) *Attorney, Agent, or Firm*—Dickstein Shapiro LLP

(57) ABSTRACT

A sensor includes a plurality of leads that have bottom surfaces extending in a first plane, a stage that extends in a second plane that tilts from the first plane, a sensor chip that is supported on the stage, a modified connection lead structure that supports the stage, and at least one projecting part extending from the stage in a first direction that tilts from the first and second planes. The at least one projecting part has a top portion that is higher in level than the bottom surfaces.

23 Claims, 24 Drawing Sheets

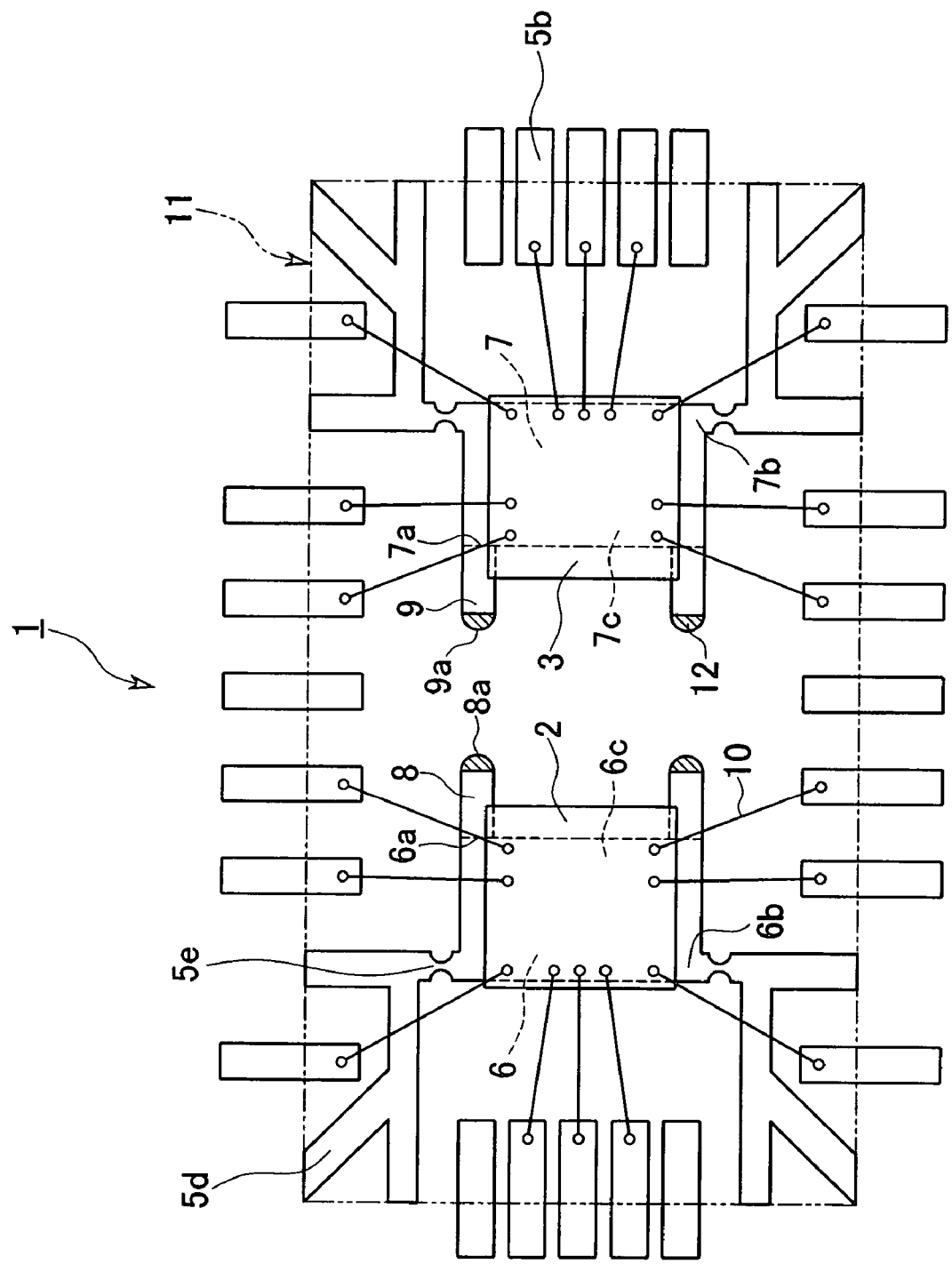

SENSOR INCLUDING LEAD FRAME AND METHOD OF FORMING SENSOR INCLUDING LEAD FRAME

BACKGROUND OF THE INVENTION

1. Field of the Invention

The present invention generally relates to a sensor including a lead frame and a method of forming a sensor including the lead frame.

Priority is claimed on Japanese Patent Application No. 2005-50879, filed Feb. 25, 2005, and Japanese Patent Application No. 2005-93636, filed Mar. 29, 2005, the contents of which are incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

In recent years, there has been an increasing requirement for integrating terminal devices such as mobile phones with a GPS (Global Positioning System) function, which indicates information about a user's position. The GPS function can be realized by using a sensor for sensing or measuring a physical quantity such as a magnetic sensor or an acceleration sensor. The magnetic sensor integrated in the terminal device senses or measures a geomagnetic field in order to sense or measure the azimuth or direction in a three-dimensional space of the terminal device. The acceleration sensor integrated in the terminal device senses or measures the direction of motion of the terminal device in order to sense or measure the position of the terminal device. A typical example of the sensor for sensing a physical quantity may include, but is not limited to, a plurality of sensor chips such as magnetic sensor chips that are placed to be tilted from each other. This placement of the sensor chips can be effective to scale down the sensor and reduce the thickness of the sensor.

The sensor with the tilted or sloped sensor chips has a high sensitivity in axial directions vertical to planes that include the sloped sensor chips and a poor sensitivity in other axial directions such as axial directions parallel to a surface of a substrate. This type of sensor will be the main trend in the future.

FIG. 24 is a plan view illustrating a conventional sensor for sensing a physical quantity. FIG. 25 is a cross sectional elevation view of the sensor of FIG. 24. FIG. 26 is a plan view of a lead frame to be used for forming the sensor of FIG. 24. A sensor 1 for sensing a physical quantity includes a pair of sensor chips 2 and 3 that are tilted from each other so as to sense or measure the direction and the magnitude of an external magnetic field. The sensor 1 of FIG. 24 can be formed using a lead frame 4 of FIG. 26. The lead frame 4 can be formed through a press working and/or etching process for a metal plate.

The lead frame 4 of FIG. 26 includes a frame 5 and a pair of stages 6 and 7 that are supported by the frame 5. The frame 5 further includes a rectangle frame portion 5a, a plurality of leads 5b, and modified connection leads 5d. The rectangle frame portion 5a defines a rectangle internal region. The rectangle frame portion 5a has four corners 5c, two long sides and two short sides. The plurality of leads 5b extend from the rectangle frame portion 5a into the internal region. The modified connection leads 5d extend from the corners 5c of the rectangle frame portion 5a into the internal region. The stages 6 and 7 are disposed in the internal region and supported by first and second pairs of the modified connection leads 5d.

The lead frame 4 has a first center line parallel to the two long sides of the rectangle frame portion 5a and a second center line parallel to the two short sides of the rectangle frame portion 5a. The first and second center lines are perpendicular to each other. The stages 6 and 7 have a rectangle shape. The second center line divides the internal region into two sub-regions. The stages 6 and 7 are disposed in the two sub-regions, receptively, so as to be distanced from the second center line. The stages 6 and 7 are positioned symmetrically with reference to a reflection-symmetric axis of the second center line. Each of the stages 6 and 7 extends symmetrically with reference to another reflection-symmetric axis of the first center line. The frame 5 is symmetrical with reference to the reflection-symmetric axes of the first and second center lines. The stage 6 has a first surface on which a sensor chip 2 is mounted and a second surface opposite to the first surface. The stage 7 has a first surface on which a sensor chip 3 is mounted and a second surface opposite to the first surface. The stage 6 has a pair of projecting parts 8 that project toward the counterpart stage 7 and tilt from a plane including the stage 6 toward a space to which the second surface faces. The projecting parts 8 are distanced from the second center line. The stage 7 has a pair of projecting parts 9 that project toward the counterpart stage 6 and tilt from a plane including the stage 7 toward the space to which the second surface faces. The projecting parts 9 are distanced from the second center line.

The modified connection leads 5d comprise suspension leads that suspend the stages 6 and 7 from the rectangle frame portion 5a. Each of the modified connection leads 5d has a twistable portion 5e that is connected with and adjacent to a side edge 6b or 7b of the stage 6 or 7. The twistable portion 5e comprises a narrow portion that is defined by recessed sides. Twisting the twistable portions 5e tilts or slopes the stage 6 or 7 from a plane including the frame 5.

The sensor 1 shown in FIGS. 24 and 25 includes the plurality of leads 5b, the modified connection leads 5d with the twisted portions 5e, the sloped stages 6 and 7 with the sloped sensor chips 2 and 3, wirings 10 that electrically connect the sloped sensor chips 2 and 3 to the leads 5b, and a resin mold 11 that encapsulates the sensor chips 2 and 3 and the plurality of leads 5b. The resin mold 11 is formed by an injection molding process. When the injection molding process has been completed, the leads 5b and the modified connection leads 5d have outside portions that are positioned outside the resin mold 11 and the rectangle frame portion 5a. The leads 5b and the modified connection leads 5d are detruncated to remove the outside portions and the rectangle frame portion 5a, thereby completing the sensor 1. This is disclosed in Japanese Unexamined Patent Application, First Publication, No. 2004-128473.

A broken line in FIGS. 24, 25 and 26 represents the periphery of the resin mold 11. The resin mold 11 has a rectangle shape in plan view and a trapezoidal shape in cross section. The resin mold 11 has a first surface and a second surface 11a that is opposite to the first surface. The first surface is a top surface and the second surface 11a is a bottom surface. The lead frame 4 has a first surface and a second surface 4a opposite to the first surface. The lead frame 5 has a first surface and a second surface 5g that is opposite to the first surface. The second surface 4a includes the second surface 5g. The second surface 5g of the lead frame 5 appears in the second surface 11a of the resin mold 11. Namely, the second surface 5g is exposed from the second surface 11a. The projecting parts 8 and 9 have top portions 8a and 9a that are positioned on the second surface 11a of the resin mold 11. The stages 6 and 7 with the sensor chips 2 and 3 are sloped from the second surface 11a of the resin mold 11. The stage 6 extends in a first plane that tilts from a second plane that includes the second surface 11a of the resin mold 11. The stage 7 extends in a third plane that tilts from the second plane and also from the first plane. The first and third planes cross each other at an acute angle. The sensor chips 2 and 3 are mounted on the sloped stages 6 and 7. The sloped stages 6 and 7 with the sloped sensor chips 2 and 3 are fixed to and encapsulated by the resin mold 11.

A conventional method of forming the sensor 1 will be described. FIG. 27A is fragmentary cross sectional elevation view of the lead frame 4 of FIG. 26 in a step involved in a method of forming the sensor 1 of FIGS. 24 and 25. FIG. 27B is a fragmentary cross sectional elevation view of the lead frame 4 in another step involved in the method of forming the sensor 1 of FIGS. 24 and 25. FIG. 27C is a fragmentary cross sectional elevation view of the lead frame 4 in still another step involved in the method of forming the sensor 1 of FIGS. 24 and 25.

As shown in FIGS. 26 and 27A, a metal plate having a predetermined inner region is prepared. The predetermined inner region of the metal plate is subjected to a photo-etching process to reduce the thickness in half and to form a thickness-reduced plate. The thickness-reduced plate is then subjected to a press working and/or etching process to form the lead frame 4 that includes the frame 5 and the stages 6 and 7 with the projecting parts 8 and 9. The stages 6 and 7 are supported by the modified connection leads 5d that are connected to the rectangle frame portion 5a. Each of the modified connection leads 5d has the twistable portion 5e that comprises the narrow portion defined by the recessed sides. The projecting parts 8 extend from the stage 6 toward the counterpart stage 7 and tilt from the plane including the stage 6. The projecting parts 9 extend from the stage 7 toward the counterpart stage 6 and tilt from the plane including the stage 7.

The sensor chips 2 and 3 are bonded onto the stages 6 and 7, respectively. The sensor chips 2 and 3 are electrically connected through the wirings 10 to the leads 5b. The wirings 10 are flexible and extend with a slack so as to allow, in a later process, the stages 6 and 7 with the sensor chips 2 and 3 to be sloped or tilted from the plane including the frame 5. Each of the wirings 10 has a first bonding portion 10a that is bonded with the sensor chip 2 or 3 and a second bonding portion 10b that is bonded with the lead 5b. Tilting the stages 6 and 7 with the sensor chips 2 and 3 increases a distance between the first and second bonding portions 10a and 10b of the wiring 10. The slacks of the wirings 10 allow the stages 6 and 7 to be sloped or tilted.

As shown in FIG. 27B, the lead frame 4 is interposed between first and second dies "D" and "E". The first die "D" has a concave portion and a ridge portion, while the second die "E" has a flat surface "E1". The second die "E" moves toward the first die "D", so that the flat surface "E1" presses up the projecting parts 8 and 9 until the first and second dies "D" and "E" sandwich the square frame portion 5a of the frame 5, whereby the twistable portions 5e are twisted, and the stages 6 and 7 are sloped or tilted from the plane that includes the frame 5.

As shown in FIG. 27C, the stages 6 and 7 are sloped or tilted from the plane that includes the frame 5. The magnetic sensor chips 2 and 3 which are respectively mounted on the stages 6 and 7 are also sloped or tilted together with the stages 6 and 7. The sloped magnetic sensor chips 2 and 3 have a predetermined slope angle with reference to the square frame portion 5a and to the flat surface "E1". The predetermined slope angle is determined by the projecting parts 8 and 9. For example, the predetermined slope angle is determined by a distance between the twistable portion 5e and the top 8a or 9a of the projecting part 8 or 9.

A molten resin is injected into the cavity of the dies "D" and "E" while keeping the second die "E" to push up the projecting parts 8 and 9, thereby forming a resin mold 11 that encapsulates and fixes the sloped sensor chips 2 and 3 and the sloped stages 6 and 7. The rectangle frame portion 5a and the outside portions of the leads 5b and the modified connection leads 5d are positioned outside the resin mold 11. The second surfaces of the leads 5b and the modified connection leads 5d, the rectangle frame portion 5a, the outside portions of the leads 5b and the modified connection leads 5d are exposed from the resin mold 11.

The lead frame 4 with the resin mold 11 is then immersed into an electrolytic plating solution to form plating layers on the exposed surfaces. The leads 5b and the modified connection leads 5d are detruncated to remove the rectangle frame portion 5a and the outside portions of the leads 5b and the modified connection leads 5d, while leaving the plating layers on the second surfaces of the remaining portions of the leads 5b and the remaining portions of the modified connection leads 5d, thereby completing the sensor 1.

The sensor 1 is mounted on a circuit board so that the plating layers on the second surfaces of the remaining leads 5b and the remaining modified connection leads 5d are electrically connected with the circuit board.

FIG. 28 is a bottom plan view of a sensor, taken along an A-A line of FIG. 24. The injection molding process is performed while the top portions 8a and 9a of the projecting parts 8 and 9 are in contact with the flat surface "E1" of the die "E". Thus, the molten resin when injected can not cover the top portions 8a and 9a of the projecting parts 8 and 9 so that the top portions 8a and 9a are exposed from the second surface 11a of the resin mold 11. When the sensor 1 is mounted on the circuit board, the exposed top portions 8a and 9a can electrically contact with conductive patterns of the circuit board, and a short circuit can be formed.

FIG. 29 is a cross sectional elevation view of a conventional lead frame interposed between dies "D" and "E". As shown in FIG. 29, paired dies "D" and "E" are used. The die "D" has a concave "D1" and a ridge portion that are covered with a sheet "S", while the die "E" has a flat surface "E1" that is covered with a sheet "S". The sheet "S" is flexible. When the dies "D" and "E" are closed, then the top portions 8a and 9a come tightly into contact with the sheet "S". In the injection molding process, the molten resin fills up the cavity without sealing or coating the top portions 8a and 9a, whereby the top portions 8a and 9a are not covered by the resin mold 11 and project from the bottom surface 11a of the resin mold 11. The sensor 1 has a bottom surface that includes a flat bottom of the resin mold 11, bottom surfaces of the leads 5b, and the projecting top portions 8a and 9a. The bottom surfaces of the leads 5b are leveled to the flat bottom of the resin mold 11. The projecting top portions 8a and 9a are different in level from the bottom surfaces of the leads 5b and the flat bottom of the resin mold 11. The projecting top portions 8a and 9a prevent the leads 5b from contacting with conductive patterns of the circuit board, whereby the leads 5b can not be electrically connected to the circuit board. The projecting top portions 8a and 9a further prevent the sensor from being satisfactorily mounted on the circuit board.

After the sensor with the resin mold 11 is released from the dies "D" and "E", the sensor may optionally be immersed in an electrolytic plating solution, whereby a plating layer such as a solder layer is formed on not only the exposed bottom surfaces of the leads 5b but also the projecting top portions 8a and 9b. The plating layer that covers the projecting top portions 8a and 9b is unnecessary. When the sensor is mounted on the circuit board, the unnecessary plating layer covering the top portions 8a and 9a is interposed between the sensor and the circuit board. The unnecessary plating layer prevents the leads 5b from contacting with conductive patterns of the circuit board, whereby the leads 5b can not be electrically connected to the circuit board. The unnecessary plating layer further prevents the sensor from being satisfactorily mounted on the circuit board.

In view of the above, it will be apparent to those skilled in the art from this disclosure that there exists a need for an improved lead frame, a sensor including the improved lead frame, a method of forming a lead frame and a method of forming a sensor using the lead frame. This invention addresses these needs in the art as well as other needs, which will become apparent to those skilled in the art from this disclosure.

SUMMARY OF THE INVENTION

Accordingly, it is a primary object of the present invention to provide a sensor that senses a physical quantity and includes a lead frame.

It is another object of the present invention to provide a method of forming a sensor that senses a physical quantity and includes a lead frame.

In accordance with a first aspect of the present invention, a sensor comprises: a plurality of leads that have bottom surfaces extending in a first plane; a stage that extends in a second plane that tilts from the first plane; a sensor chip that is supported on the stage; a modified connection lead structure that supports the stage; and at least one projecting part extending from the stage in a first direction that tilts from the first and second planes, the at least one projecting part having a top portion that is higher in level than the bottom surfaces.

In accordance with a second aspect of the present invention, a sensor comprises: a plurality of leads that have bottom surfaces extending in a first plane; a stage that extends in a second plane that tilts from the first plane; a sensor chip that is supported on the stage; a modified connection lead structure that supports the stage; at least one projecting part extending from the stage in a first direction that tilts from the first and second planes, the at least one projecting part having a top portion; a first insulating layer that coats the top portion of the at least one projecting part; and plating layers on the bottom surfaces of the plurality of leads, the plating layer being lowers in level than the insulating layers.

In accordance with a third aspect of the present invention, a sensor comprises: a plurality of leads that have bottom surfaces extending in a first plane; a stage that extends in a second plane that tilts from the first plane; a sensor chip that is supported on the stage; a modified connection lead structure that supports the stage; and at least one projecting part comprising a majority portion that extends from the stage in a direction tilting from the first and second planes and a top portion that extends from the majority portion in a second direction parallel to the bottom surfaces of the leads, the top portion being equal to or higher in level than the bottom surfaces.

In accordance with a fourth aspect of the present invention, a sensor comprises: a plurality of leads that have bottom surfaces extending in a first plane; a stage that extends in a second plane that tilts from the first plane; a sensor chip that is supported on the stage; a modified connection lead structure that supports the stage, the modified connection lead structure being electrically disconnected from the plurality of leads; and at least one projecting part extending from the stage in a first direction that tilts from the first and second planes, the at least one projecting part having a top portion that is equal to or higher in level than the bottom surfaces.

In accordance with a fifth aspect of the present invention, a sensor comprises: a plurality of leads that have bottom surfaces extending in a first plane; a stage that extends in a second plane that tilts from the first plane; a sensor chip that is supported on the stage; a modified connection lead structure that supports the stage; at least one projecting part extending from the stage in a first direction that tilts from the first and second planes, the at least one projecting part having a top portion; and plating layers on the bottom surfaces of the plurality of leads, the plating layers being lower in level than the top.

In accordance with a sixth aspect of the present invention, a method of forming a sensor comprises: preparing a lead frame that comprises a plurality of leads that have bottom surfaces extending in a first plane, a stage that extends in a second plane that tilts from the first plane, a sensor chip that is supported on the stage, a modified connection lead structure that supports the stage, and at least one projecting part extending from the stage in a first direction that tilts from the first and second planes, the at least one projecting part having a top portion; forming a resin mold that encapsulates the plurality of leads, the stage, the modified connection lead structure and the at least one projecting part except for the bottom surfaces and the top portion, the resin mold further having a bottom portion with a first flat surface that is leveled to the bottom surfaces; and forming a recessed portion in the bottom portion, the recessed portion having a second flat surface that is higher in level than the first flat surface and is leveled to the top portion.

In accordance with a seventh aspect of the present invention, a method of forming a sensor comprises: preparing a lead frame that comprises a plurality of leads that have bottom surfaces extending in a first plane, a stage that extends in the first plane, a sensor chip that is supported on the stage, a modified connection lead structure that supports the stage, and at least one projecting part extending from the stage in a first direction that tilts from the first plane, the at least one projecting part having a top portion that is lower in level than the bottom surfaces; and moving the top portion to a first level that is higher in level than the bottom surfaces while tilting the stage from the first plane.

In accordance with an eighth aspect of the present invention, a method of forming a sensor comprises: preparing a lead frame that comprises a plurality of leads that have bottom surfaces extending in a first plane, a stage that extends in a second plane that tilts from the first plane, a sensor chip that is supported on the stage, a modified connection lead structure that supports the stage, and at least one projecting part extending from the stage in a first direction that tilts from the first and second planes, the at least one projecting part having a top portion; forming a resin mold that encapsulates the plurality of leads, the stage, the modified connection lead structure and the at least one projecting part except for the bottom surfaces and the top portion, the resin mold further having a bottom portion with a first flat surface that is leveled to the bottom surfaces; and exposing the bottom surfaces to a plating solution while isolating the top portion from the plating solution.

In accordance with a ninth aspect of the present invention, a method of forming a sensor comprises: preparing a lead frame that comprises a plurality of leads that have bottom surfaces extending in a first plane, a stage that extends in a second plane that tilts from the first plane, a sensor chip that is supported on the stage, a modified connection lead structure that supports the stage, and at least one projecting part extending from the stage in a first direction that tilts from the first and second planes, the at least one projecting part having a top portion; and dividing the modified connection lead structure into first and second portions that are electrically disconnected from each other, the first portion being electrically connected to the at least one projecting part, the second portion being electrically connected to the plurality of leads.

In accordance with a tenth aspect of the present invention, a method of forming a sensor for sensing a physical quantity comprises: preparing a lead frame that comprises a rectangle frame portion, leads extending inwardly from the rectangle frame portion, modified connection leads extending inwardly from the rectangle frame portion, stages supported by the modified connection leads, projecting parts that project from the stages downwardly and tilt from the stages; securing sensor chips for sensing the physical quantity on the stages; pushing upwardly the projecting parts so as to tilt the stages with the sensor chips from the rectangle frame portion; forming, in a cavity, a resin mold that encapsulates the stages, the sensor chips, the projecting parts, the leads and the modified connection leads; and positioning top portions of the projecting parts at a first level that is higher than a second level of bottom surfaces of the leads.

In accordance with an eleventh aspect of the present invention, a method of forming a sensor for sensing a physical quantity comprises: preparing a lead frame that comprises a rectangle frame portion, leads extending inwardly from the rectangle frame portion, modified connection leads extending inwardly from the rectangle frame portion, stages supported by the modified connection leads, projecting parts that project from the stages downwardly and tilt from the stages; securing sensor chips for sensing the physical quantity on the stages; pushing upwardly the projecting parts so as to tilt the stages with the sensor chips from the rectangle frame portion; forming, in a cavity, a resin mold that encapsulates the stages, the sensor chips, the projecting parts, the leads and the modified connection leads; and immersing the lead frame with the resin mold into a plating solution so as to form plating layers on bottom surfaces of the leads without forming a plating layer on each of top portions of the projecting parts.

In accordance with a twelfth aspect of the present invention, a sensor for sensing a physical quantity comprises: a rectangle frame portion; leads extending inwardly from the rectangle frame portion; modified connection leads extending inwardly from the rectangle frame portion; stages supported by the modified connection leads and tilting from the rectangle frame portion; sensor chips for sensing the physical quantity secured on the stages and tilting from the rectangle frame portion; projecting parts that project from the stages downwardly and tilt from the stages; a resin mold that encapsulates the leads, the modified connection leads, the stages, the sensor chips and the projecting parts, except for bottom surfaces of the leads and top portions of the projecting parts; and plating layers that coat bottom surfaces of the leads.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure:

FIG. 11 is a fragmentary plan view illustrating a sensor for sensing a physical quantity in accordance with a fourth preferred embodiment of the present invention;

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 1:
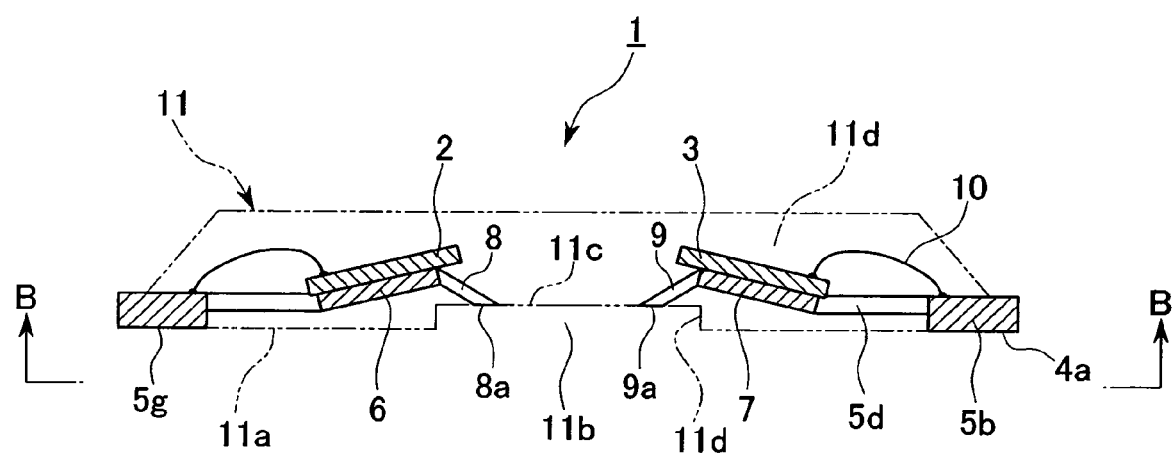
FIG. 1 is a fragmentary cross sectional elevation view illustrating a sensor for sensing a physical quantity in accordance with a first preferred embodiment of the present invention.
Figure 2:
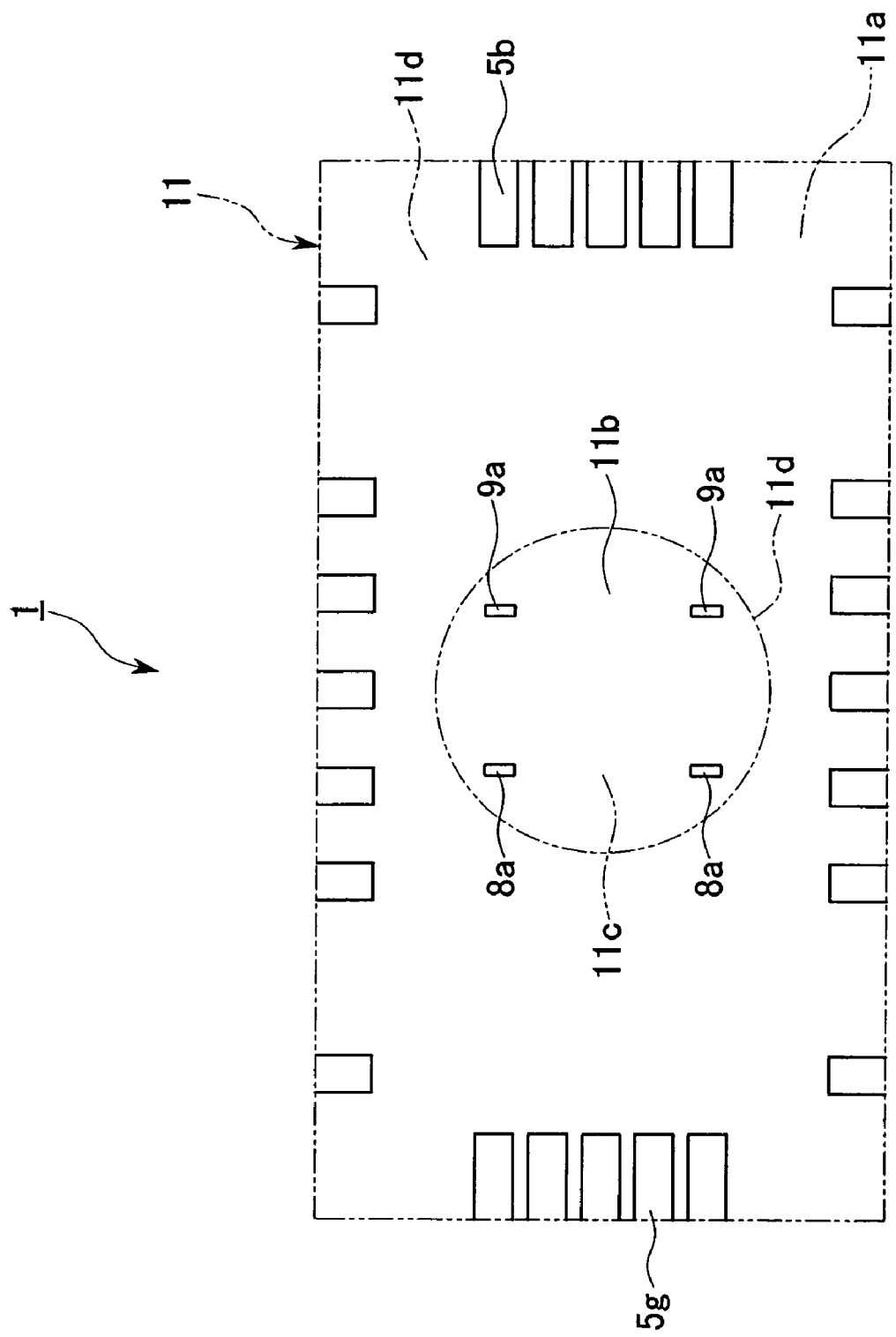
FIG. 2 is a bottom plan view of the sensor of FIG. 1.

FIG. 1 is a fragmentary cross sectional elevation view illustrating a sensor for sensing a physical quantity in accordance with a first preferred embodiment of the present invention. FIG. 2 is a bottom plan view of the sensor of FIG. 1. The following descriptions will be directed to a difference of the sensor of the first embodiment from the above-described conventional sensor.

Figure 26:
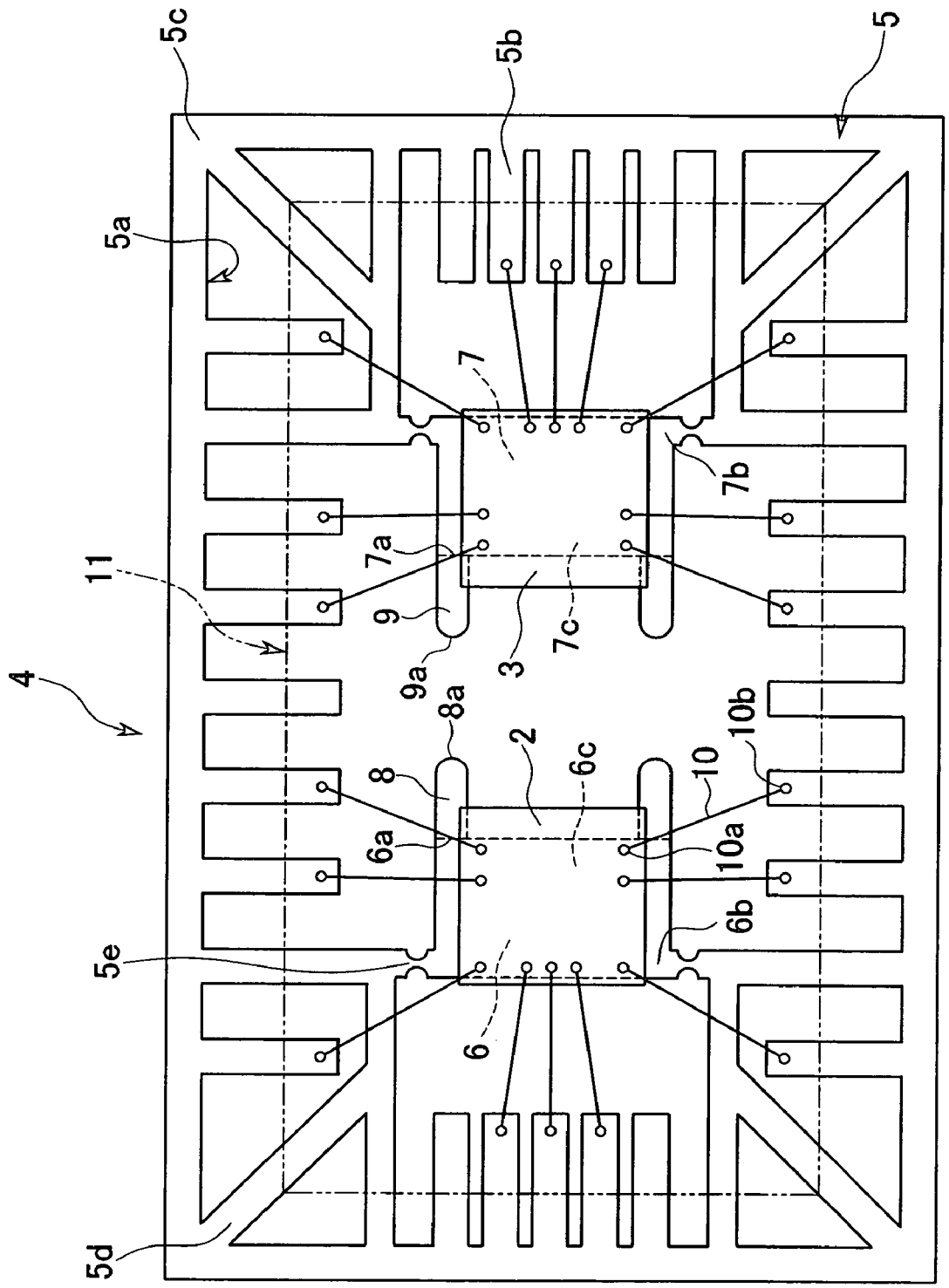
FIG. 26 is a plan view of a lead frame to be used for forming the sensor of FIG. 24.

A sensor 1 for sensing a physical quantity is shown in FIG. 1. The sensor 1 includes a pair of sloped sensor chips that sense the direction and the magnitude of an external magnetic field. The sensor 1 is formed using a lead frame 4 that is shown in FIG. 26. The sensor 1 may be the type of surface mount package such as a QFN (Quad Flat Non-Leaded) package and an SON (Small Outline Non-Leaded) package.

The sensor 1 shown in FIGS. 1 and 2 includes a plurality of leads 5b, modified connection leads 5d, sloped stages 6 and 7, sensor chips 2 and 3, projecting parts 8 and 9, wirings 10, and a resin mold 11. The lead frame 4 with the projecting parts 8 and 9 is made of a conductive material such as a metal. The sloped stages 6 and 7 are supported by the modified connection leads 5d. The sensor chips 2 and 3 are mounted on the sloped stages 6 and 7, respectively. The sensor chips 2 and 3 are electrically connected through the wirings 10 to the leads 5b. The projecting parts 8 and 9 extend from the stages 6 and 7, respectively. The resin mold 11 encapsulates the leads 5b, the modified connection leads 5d, the sloped stages 6 and 7, the sensor chips 2 and 3, the projecting parts 8 and 9 and the wirings 10.

The resin mold 11 has a generally trapezoidal shape in cross section that is defined by a flat top portion, sloped side walls and a lower portion. The lower portion further comprises a bottom portion 11a and a recessed portion 11b. The bottom portion 11a has a flat surface. The recessed portion 11b is defined by a flat surface 11c and a side wall 11d. The flat surface 11c is different in level from the flat surface of the bottom portion 11a. Namely, the flat surface 11c has a level that is higher than a level of the flat surface of the bottom portion 11a. The recessed portion 11b has a circular shape in plan view. The projecting parts 8 and 9 have top portions 8a and 9a that are leveled to the flat surface 11c of the recessed portion 11b. Thus, the top portions 8a and 9a are different in level from the flat surface of the bottom portion 11a. Namely, the top portions 8a and 9a have a level that is higher than the level of the flat surface of the bottom portion 11a. The leads 5b have second surfaces 5g that define bottom surfaces 4a of the lead frame 4. The top portions 8a and 9a are different in level from the second surfaces 5g of the leads 5. Namely, the top portions 8a and 9a have a level that is higher than the second surfaces 5g of the leads 5.

The recessed portion 11b may be formed by recessing or cutting part of the bottom portion of the resin mold 11.

A method of forming the above-described sensor 1 will be described. The lead frame described above with reference to FIG. 26 is prepared by a known method. The sensor chips 2 and 3 are mounted on surfaces 6c and 7c of the stages 6 and 7, respectively. The sensor chips 2 and 3 are electrically connected through the wirings 10 to the leads 5b.

Figure 27A:
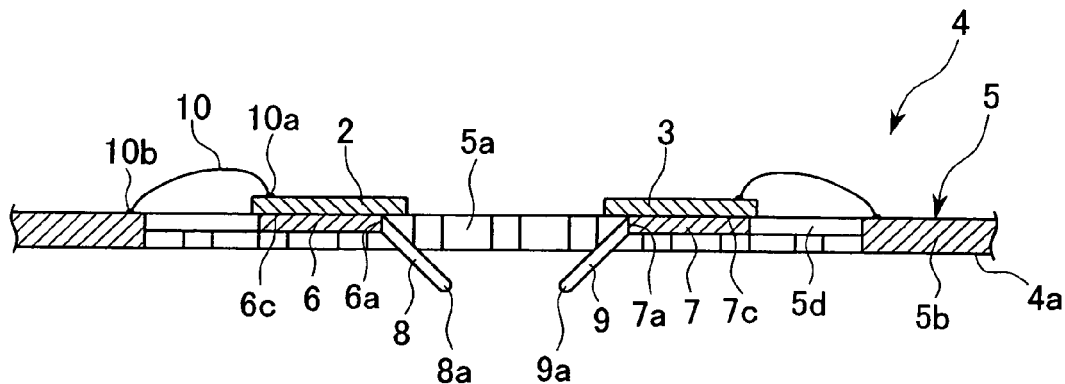
FIG. 27A is fragmentary cross sectional elevation view of the lead frame 4 of FIG. 26 in a step involved in a method of forming the sensor of FIGS. 24 and 25.
Figure 27B:
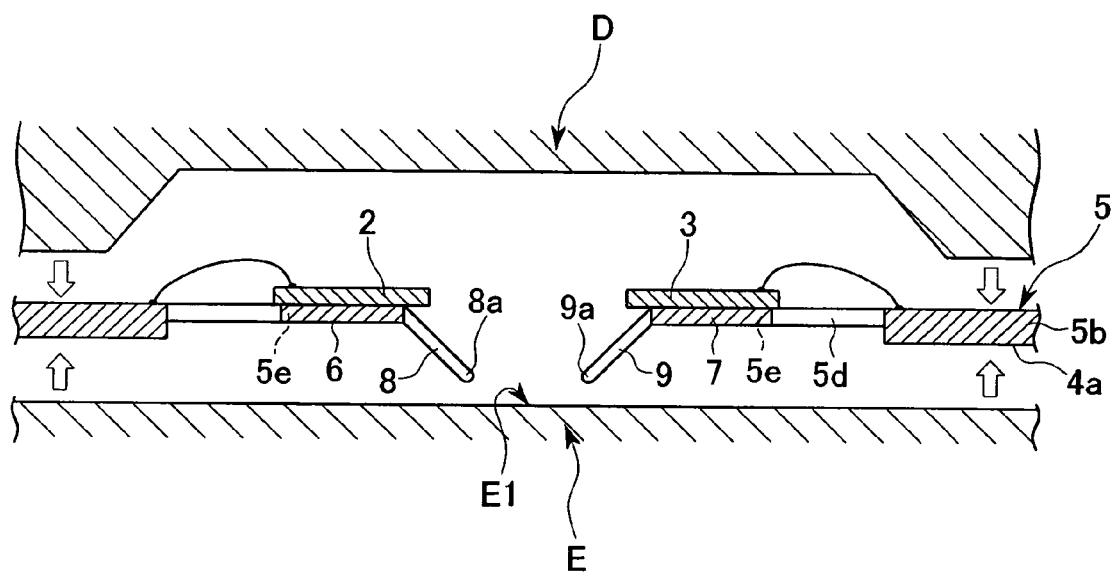
FIG. 27B is a fragmentary cross sectional elevation view of the lead frame 4 in another step involved in the method of forming the sensor of FIGS. 24 and 25.
Figure 27C:
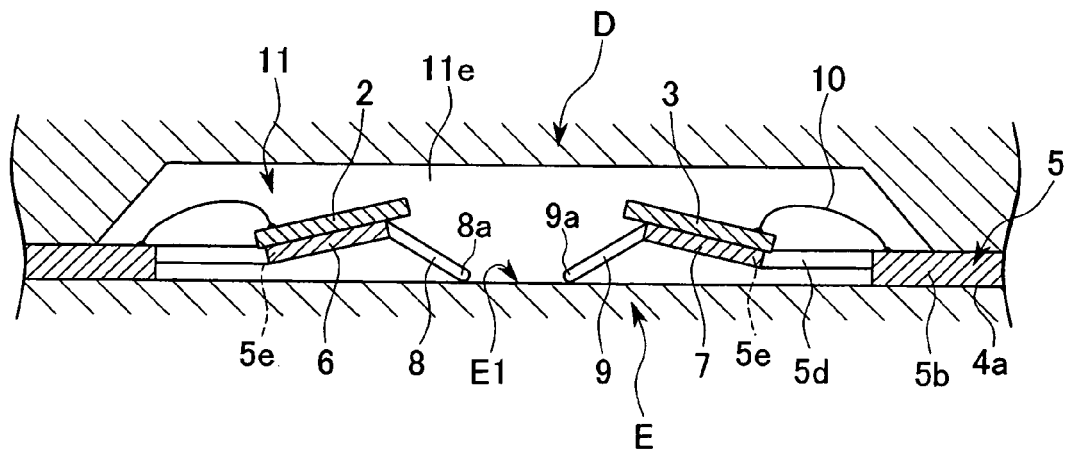
FIG. 27C is a fragmentary cross sectional elevation view of the lead frame 4 in still another step involved in the method of forming the sensor of FIGS. 24 and 25.

With reference again to FIGS. 27A, 27B and 27C, the lead frame 4 is prepared. The lead frame 4 is placed between paired dies "D" and "E". The die "D" moves toward the counterpart die "E" and a flat surface "E1" of the die "E"

pushes the projecting parts 8 and 9, whereby twistable portions 5e of the modified connection leads 5d are twisted and the stages 6 and 7 with the magnetic sensor chips 2 and 3 are tilted or sloped, while the top portions 8a and 9a of the projecting parts 8 and 9 still contact tightly with the flat surface "E1".

An injection molding process is performed to inject a molten resin into a cavity defined by the combined dies "D" and "E" so as to form the resin mold 11 that encapsulates the leads 5b, the modified connection leads 5d, the sloped stages 6 and 7, and the sloped sensor chips 2 and 3.

Figure 28:
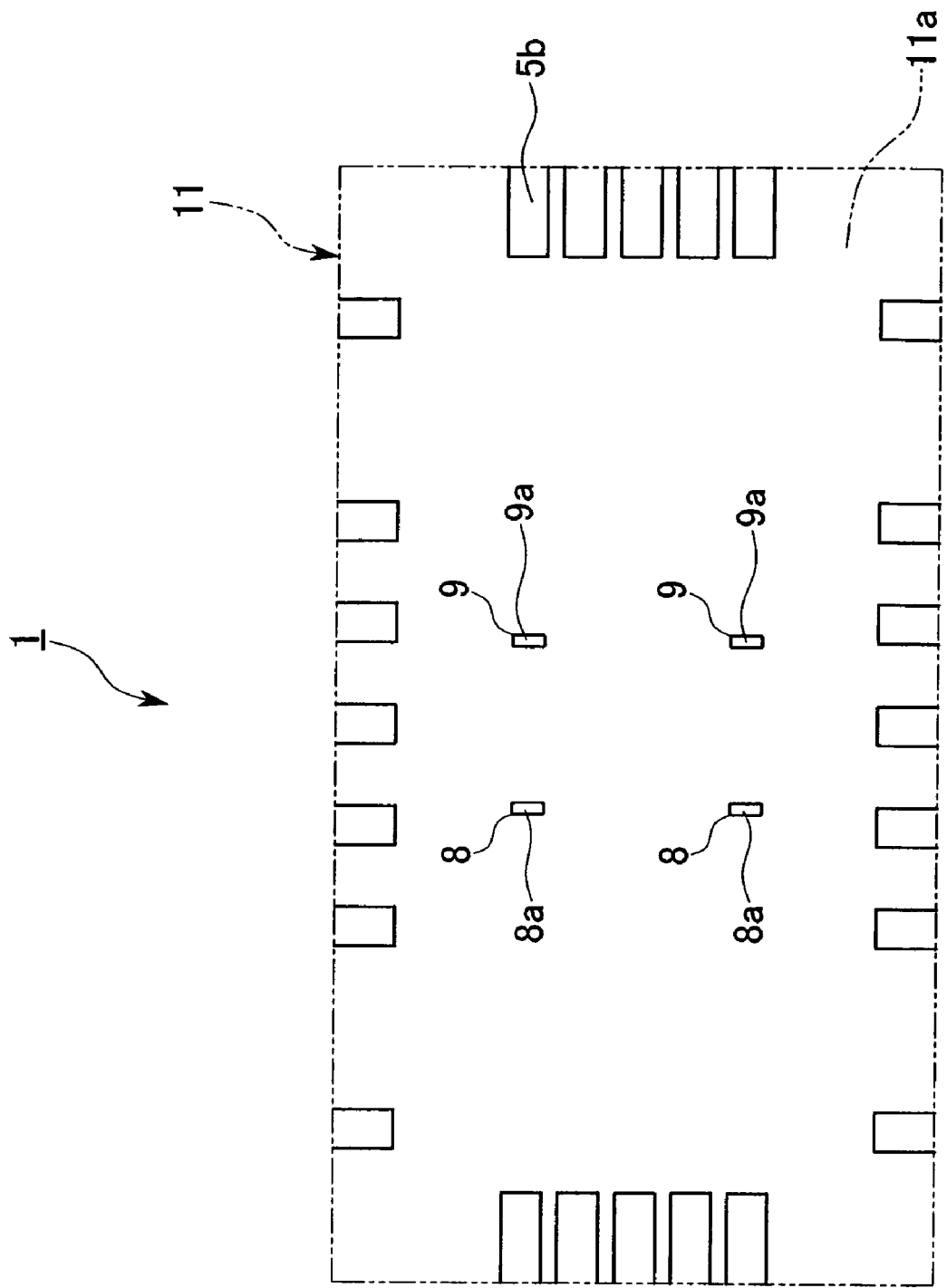
FIG. 28 is a bottom plan view of a sensor, taken along an A-A line of FIG. 24.
Figure 29:
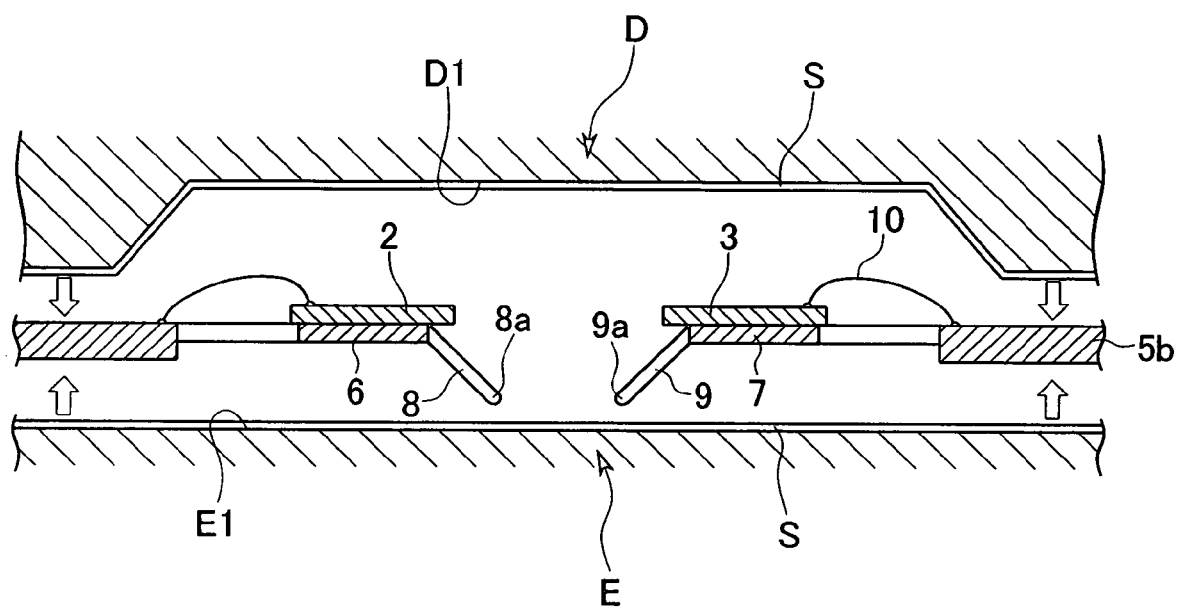
FIG. 29 is a cross sectional elevation view of the conventional lead frame interposed between dies "D" and "E".

FIG. 28 is a bottom plan view illustrating the resin mold 11 that encapsulates the lead frame 4. The leads 5b have surfaces that are exposed from the bottom surface 11a of the resin mold 11. The top portions 8a and 9a of the projecting parts 8 and 9 are also exposed from the bottom surface 11a of the resin mold 11.

The lead frame 4 with the resin mold 11 is released from the dies "D" and "E" and then immersed into an electrolytic plating solution so as to form plating layers on the exposed surfaces of the leads 5b and the top portions 8a and 9a of the projecting parts 8 and 9. The plating layers may be, but are not limited to, solder layers.

When the injection molding process has been completed, the resin mold 11 has a generally trapezoidal shape in cross section that is defined by a flat top portion, sloped side walls and the flat bottom portion 11a. The bottom portion 11a has a predetermined region that includes the top portions 8a and 9a. The predetermined region of the bottom portion 11a is removed by using a known technique such as a laser beam or a sand blast, so as to form the recessed portion 11b that is surrounded by the non-recessed bottom portion 11a, while detruncating the projecting parts 8 and 9 and forming new top portions 8a and 9a of the detruncated projecting parts 8 and 9. This removal can be made after the lead frame 4 with the resin mold 11 has been released from the dies "D" and "E" and before it is immersed into the electrolytic plating solution. Alternatively, the removal can be made after the lead frame 4 with the resin mold 11 is immersed into the electrolytic plating solution. The lower portion of the resin mold 11 comprises the bottom portion 11a and the recessed portion 11b. The bottom portion 11a has a flat surface. The recessed portion 11b is defined by the flat surface 11c and the side wall 11d. The flat surface 11c is different in level from the flat surface of the bottom portion 11a. Namely, the flat surface 11c has a level that is higher than a level of the flat surface of the bottom portion 11a. The recessed portion 11b has a circular shape in plan view. The top portions 8a and 9a of the projecting parts 8 and 9 are leveled to the flat surface 11c of the recessed portion 11b. Thus, the top portions 8a and 9a are different in level from the flat surface of the bottom portion 11a. The flat surface of the bottom portion 11a is leveled to the second surfaces 5g of the leads 5. Namely, the top portions 8a and 9a have a level that is higher than the flat surface of the bottom portion 11a and the second surfaces 5g of the leads 5.

The leads 5b and the modified connection leads 5b have outside portions that extend outside the resin mold 11. The rectangle frame portion 5a is also positioned outside the resin mold 11. The rectangle frame portion 5a is then cut off and removed from the resin mold 11. The outside portions of the leads 5b and the modified connection leads 5d are detruncated and removed from the resin mold 11, thereby completing the sensor 1.

The sensor 1 has the leads 5b that have the second surfaces 5g that are coated with the metal layer. The plating layers are formed by immersing the lead frame 4 with the resin mold 11 into the electrolytic plating solution. The sensor 1 is mounted on a circuit board so that the plating layers that coat the second surfaces 5g make contact with conductive patterns of the circuit board, while the top portions 8a and 9a of the detruncated projecting parts 8 and 9 that are leveled to the flat surface 11c of the recessed portion 11b are distanced from the circuit board. This ensures that the leads 5b make contact with the conductive pattern of the circuit board, whereby the leads 5b can be electrically connected to the circuit board, and the sensor 1 can be reliably mounted on the circuit board.

In accordance with the above-described method of forming the sensor 1, after the injection molding process has been completed or after the lead frame 4 with the resin mold 11 has been immersed into the electrolytic plating solution, then the projecting parts 8 and 9 are detruncated, while the predetermined region of the bottom portion 11a is removed, thereby forming the recessed portion 11b. The top portions 8a and 9a of the detruncated projecting parts 8 and 9 are leveled to the flat surface 11c of the recessed portion 11b and higher in level than the second surfaces 5g of the leads 5b. This ensures that the leads 5b make contact with the conductive pattern of the circuit board, whereby the leads 5b can be electrically connected to the circuit board and the sensor 1 can be reliably mounted on the circuit board.

In accordance with the first embodiment, the projecting parts 8 and 9 are detruncated, while the predetermined region of the bottom portion 11a of the resin mold 11 is removed. It is possible as a modification of the first embodiment for the projecting parts 8 and 9 to be detruncated without removing any part of the bottom portion 11a of the resin mold 11, so that the top portions 8a and 9a of the detruncated projecting parts 8 and 9 are higher in level than the flat surface of the bottom portion 11a of the resin mold 11.

In accordance with the first embodiment, the projecting parts 8 and 9 are shaped like a slender rod. The stage 6 has a proximal side 6a to the stage 7. The stage 7 has a proximal side 7a to the stage 6. The projecting parts 8 and 9 extend from the proximal sides 6a and 7a toward the stages 7 and 6, respectively. It is possible as a modification that a plurality of the projecting parts 8 and 9 are alternatively aligned in a direction of width of the stages 6 and 7. The positions from which the projecting parts 8 and 9 extend should not be limited to the proximal sides 6a and 7a. The shape of the projecting parts 8 and 9 should not be limited to that of a slender rod.

Figure 3:
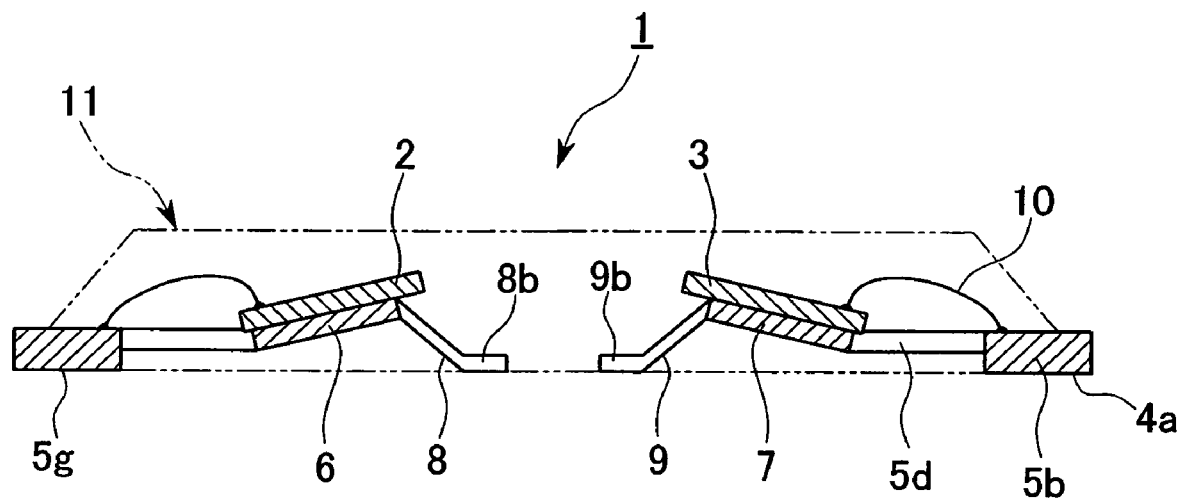
FIG. 3 is a fragmentary cross sectional elevation view illustrating a sensor for sensing a physical quantity in accordance with a modification of the first preferred embodiment of the present invention.

FIG. 3 is a fragmentary cross sectional elevation view illustrating a sensor for sensing a physical quantity in accordance with a modification of the first preferred embodiment of the present invention. As shown in FIG. 3, the projecting parts 8 and 9 have bent portions 8b and 9b that extend in parallel to the flat surface of the bottom portion 11a of the resin mold 11. The projecting parts 8 and 9 are buried in the resin mold 11. The bent portions 8b and 9b have exposed surfaces that are shown from the flat surface of the bottom portion 11a of the resin mold 11. The exposed surfaces of the bent portions 8b and 9b may be coated with a metal layer that is formed when immersed in the electrolytic plating solution. It may be advantageous to further modify the bent portions 8b and 9b so as to reduce the area of the metal layer that coats the surfaces of the bent portions 8b and 9b or to make it easy to remove the metal layer from the surfaces of the bent portions 8b and 9b.

Figure 4:
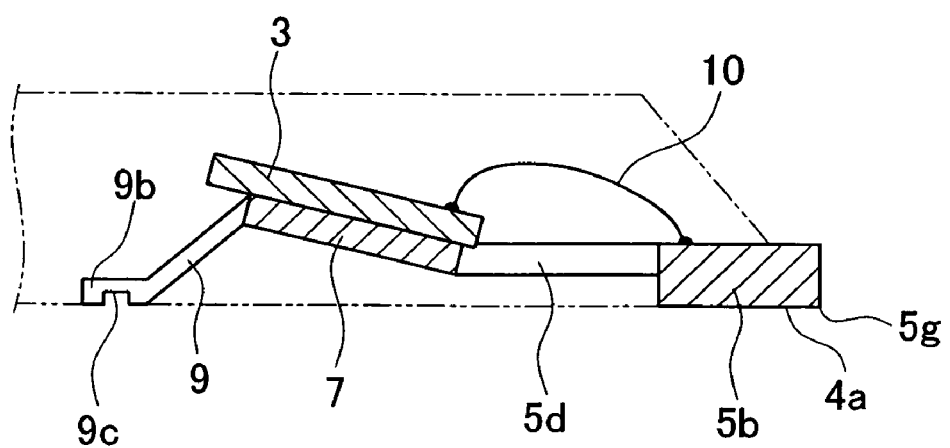
FIG. 4 is a fragmentary cross sectional elevation view illustrating modified projecting parts of the sensor in accordance with another modification of the first preferred embodiment of the present invention.

FIG. 4 is a fragmentary cross sectional elevation view illustrating modified projecting parts of the sensor in accordance with another modification of the first preferred embodiment of the present invention. The projecting parts 8 and 9 have modified bent portions 8b and 9b that have one or more grooves 8c and 9c. The grooves 8c and 9c reduce the area of the exposed surfaces of the bent portions 8b and 9b, thereby reducing the area of the metal layer that coats the surfaces of the bent portions 8b and 9b and also making it easy to remove the metal layer from the surfaces of the bent portions 8b and 9b.

Figure 5A:
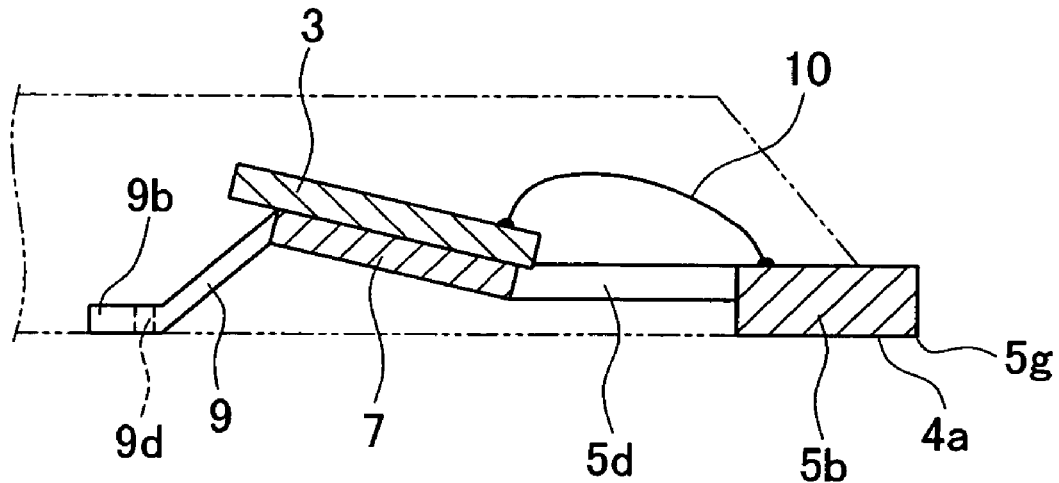
FIG. 5A is a fragmentary cross sectional elevation view illustrating modified projecting parts of the sensor in accordance with a further modification of the first preferred embodiment of the present invention.
Figure 5B:
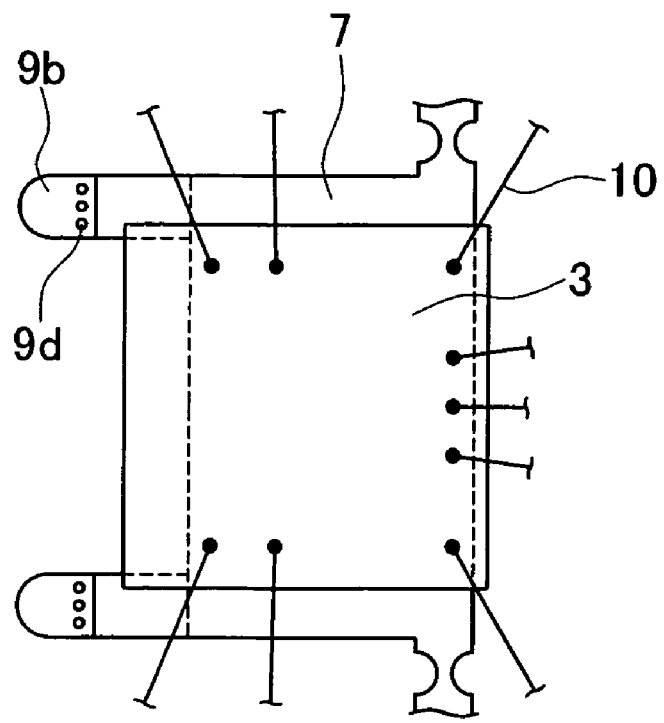
FIG. 5B is a fragmentary plan view of the projecting parts of FIG. 5A.

FIG. 5A is a fragmentary cross sectional elevation view illustrating modified projecting parts of the sensor in accordance with a further modification of the first preferred embodiment of the present invention. FIG. 5B is a fragmentary plan view of the projecting parts of FIG. 5A. The projecting parts 8 and 9 have further modified bent portions 8b and 9b that have plural through holes 8d and 9d. The through holes 8d and 9d reduce the area of the exposed surfaces of the bent portions 8b and 9b, thereby reducing the area of the metal layer that coats the surfaces of the bent portions 8b and 9b and also making it easy to remove the metal layer from the surfaces of the bent portions 8b and 9b.

Figure 6:
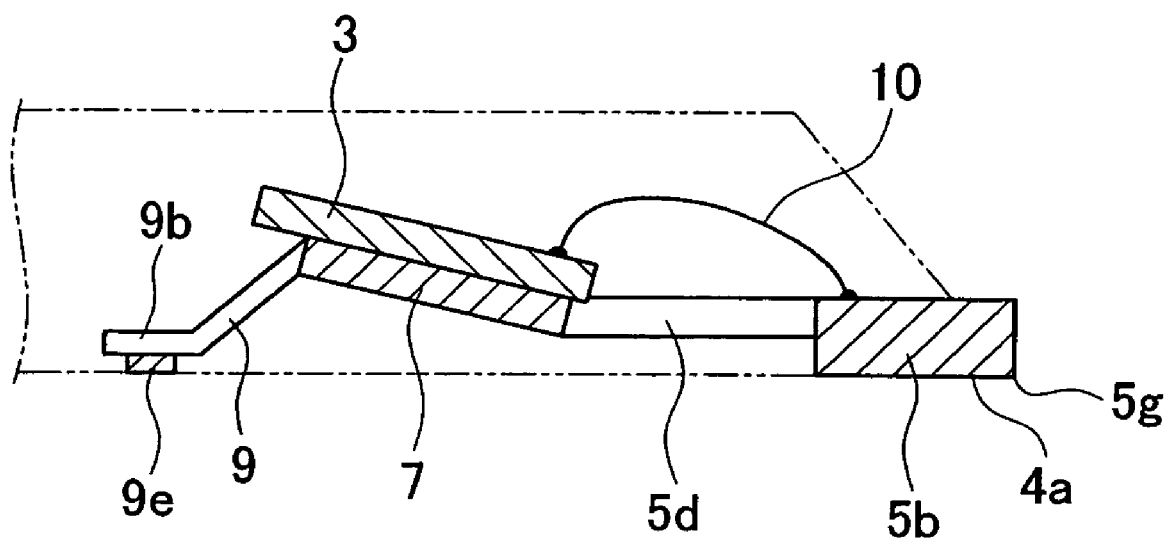
FIG. 6 is a fragmentary cross sectional elevation view illustrating modified projecting parts of the sensor in accordance with a still further modification of the first preferred embodiment of the present invention.

FIG. 6 is a fragmentary cross sectional elevation view illustrating modified projecting parts of the sensor in accordance with a still further modification of the first preferred embodiment of the present invention. The projecting parts 8 and 9 have modified bent portions 8b and 9b that have protrusions 8e and 9e that protrude downwardly. The protrusions 8e and 9e are exposed, while the modified bent portions 8b and 9b are buried in the resin mold 11, thereby reducing the area of the metal layer that coats the surfaces of the bent portions 8b and 9b and also making it easy to remove the metal layer from the surfaces of the bent portions 8b and 9b.

Figure 7:
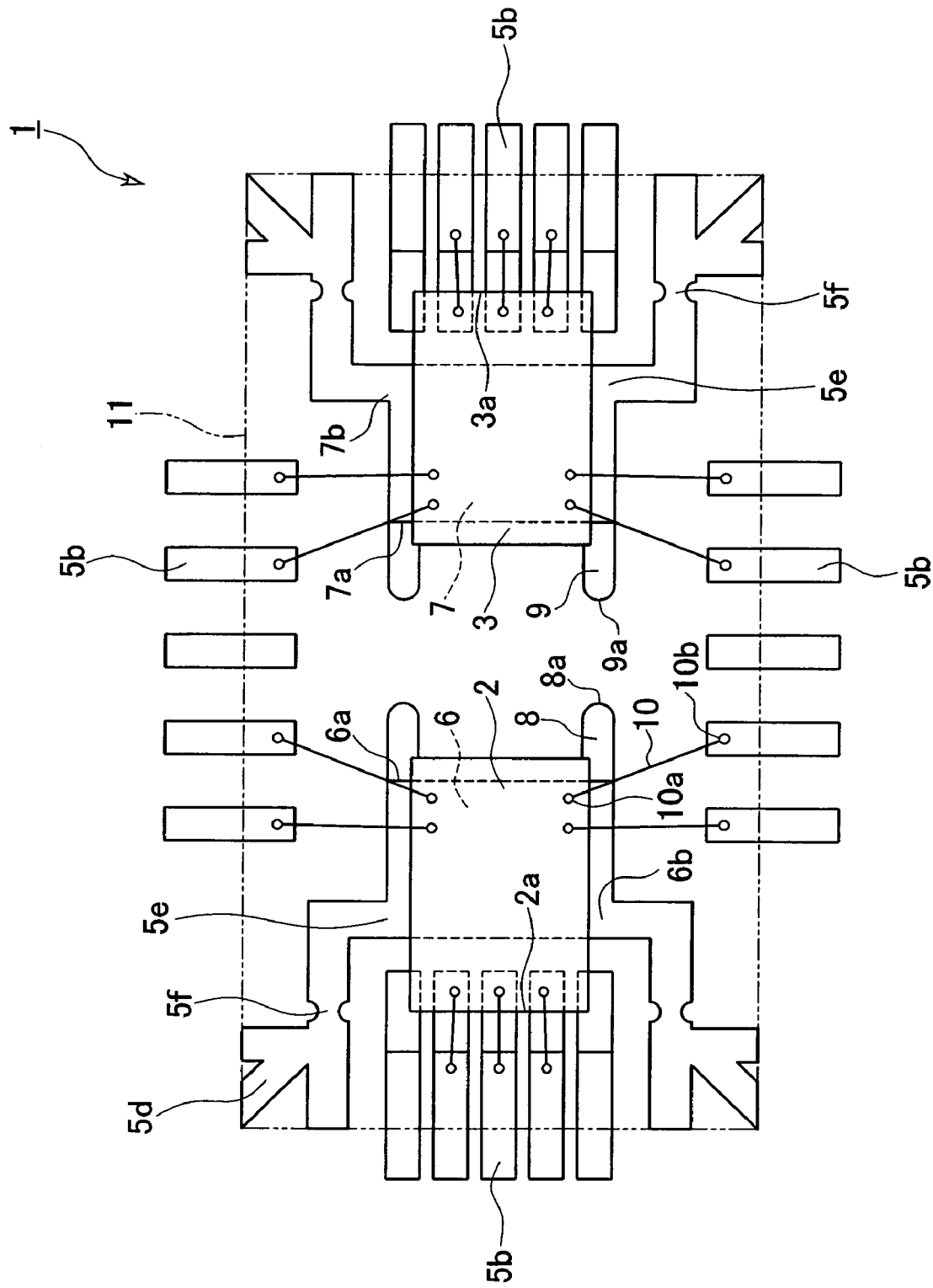
FIG. 7 is a fragmentary plan view illustrating a sensor for sensing a physical quantity in accordance with yet a further modification of the first preferred embodiment of the present invention.
Figure 8:
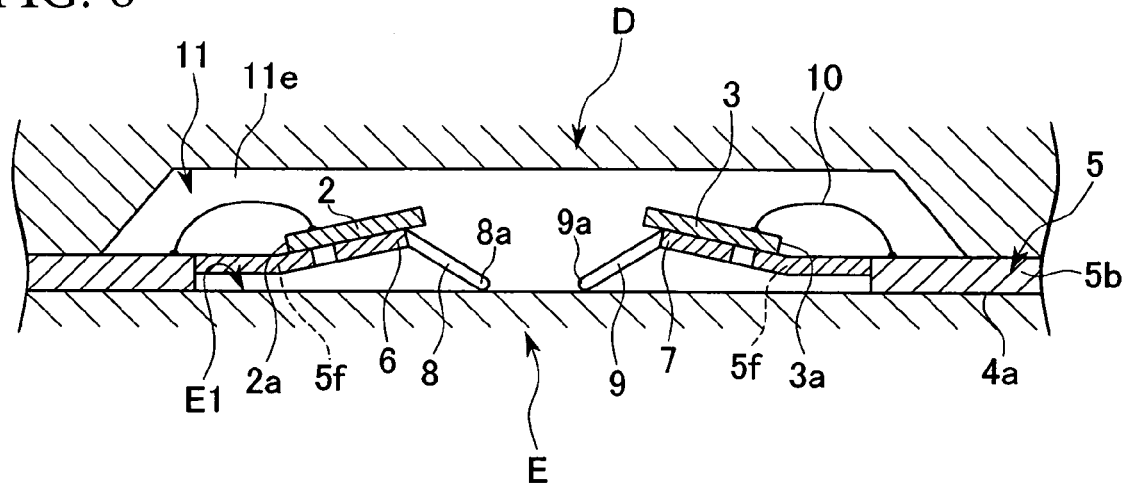
FIG. 8 is a fragmentary cross sectional elevation view illustrating the sensor of FIG. 7.

In accordance with the first embodiment of the present invention, the modified connection lead 5d has the twistable portion 5e as shown in FIGS. 24-27C. It is possible as a modification of the first embodiment for the modified connection lead to have a bendable portion and a non-twistable portion. Bending the bendable portions of the modified leads 5d without twisting the non-twistable portion causes the stage to be sloped or tilted. FIG. 7 is a fragmentary plan view illustrating a sensor for sensing a physical quantity in accordance with yet a further modification of the first preferred embodiment of the present invention. FIG. 8 is a fragmentary cross sectional elevation view illustrating the sensor of FIG. 7. The bendable portion 5f is narrower in width than other portions of the modified connection lead 5d. Bending the bendable portions 5f of the modified leads 5d without twisting the non-twistable portion 5e causes the stage 6 or 7 to be sloped or tilted.

As shown in FIGS. 7 and 8, the sensor chips 2 and 3 have first sides 2a and 3a which are proximal to the leads 5b and are positioned over inner portions of the leads 5b and outside the stages 6 and 7. The first sides 2a and 3a of the sensor chips 2 and 3 are electrically connected to the leads 5b through the wirings 10. The inner portions of the leads 5b mechanically support the first sides 2a and 3a of the sensor chips 2 and 3. The first sides 2a and 3a of the sensor chips 2 and 3 may be attached to the inner portions of the leads 5b. The inner portions are thinner than the remaining portions of the leads 5b so that the inner portions are bendable. A typical example of the thickness of the inner portions may be, but does not have to be, a half of the thickness of the leads 5b. It is also possible as a further modification of the first embodiment for the inner portions of the leads 5b to mechanically support and extend under the first sides 2a and 3a of the sensor chips 2 and 3 without attaching the inner portions of the leads 5b to the first sides 2a and 3a of the sensor chips 2 and 3. Namely, the first sides 2a and 3a of the sensor chips 2 and 3 may be positioned over the inner portions of the leads 5b.

The die "E" moves toward the counterpart die "D" while the flat surface "E1" pushes the projecting parts 8 and 9 so as to bend the bendable portions 5f of the modified connection leads 5d and the thin inner portions of the leads 5b, thereby causing the stages 6 and 7 to be sloped or tilted without twisting the non-twistable portions 5e.

Second Embodiment

Figure 9A:
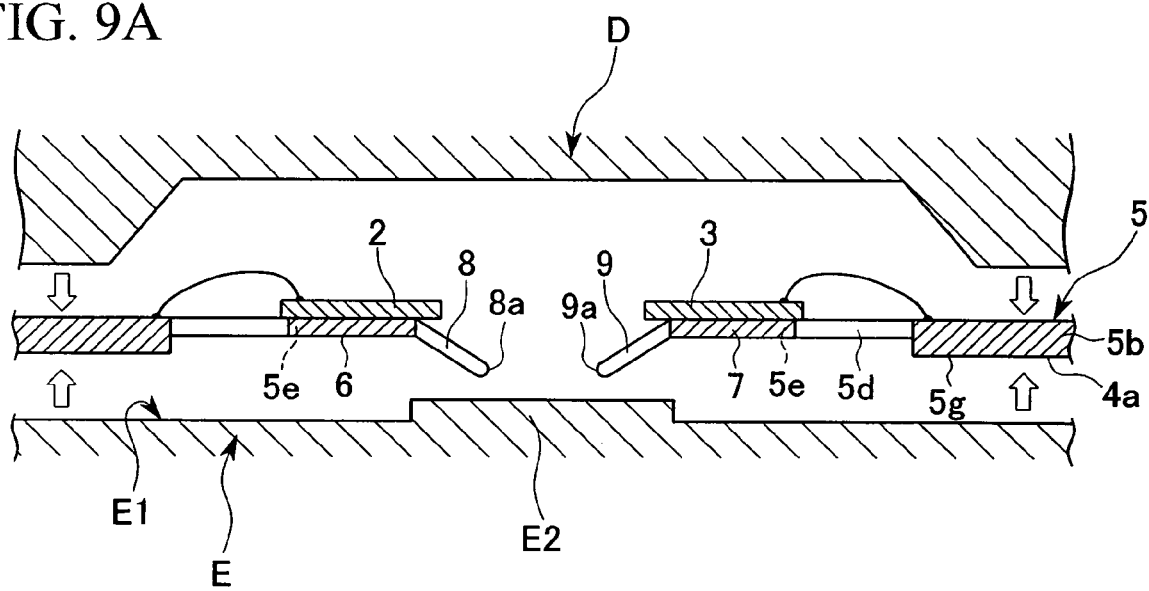
FIG. 9A is a fragmentary cross sectional elevation view of the lead frame in a step involved in the method of forming the sensor of FIGS. 1 and 2 in accordance with a second embodiment of the present invention.
Figure 9B:
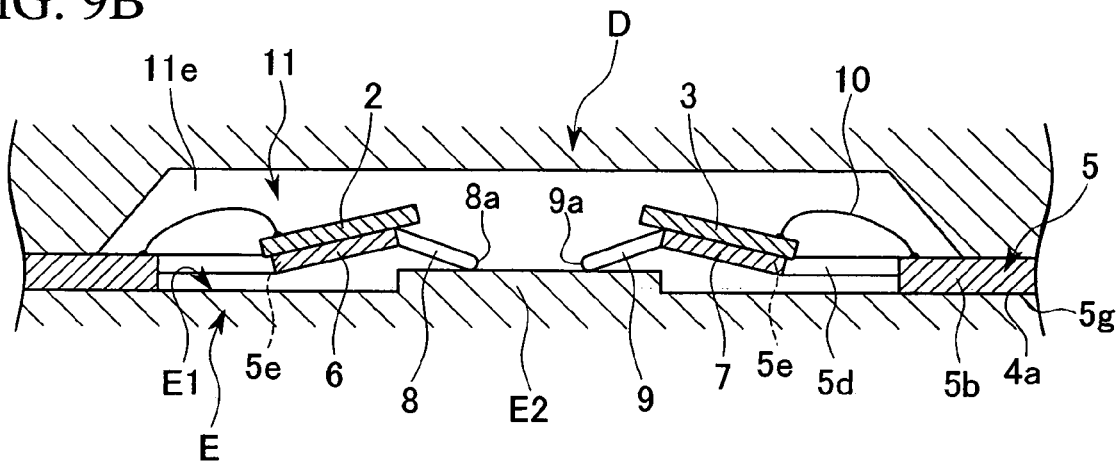
FIG. 9B is a fragmentary cross sectional elevation view of the lead frame in another step involved in the method of forming the sensor of FIGS. 1 and 2 in accordance with the second embodiment of the present invention.
Figure 24:
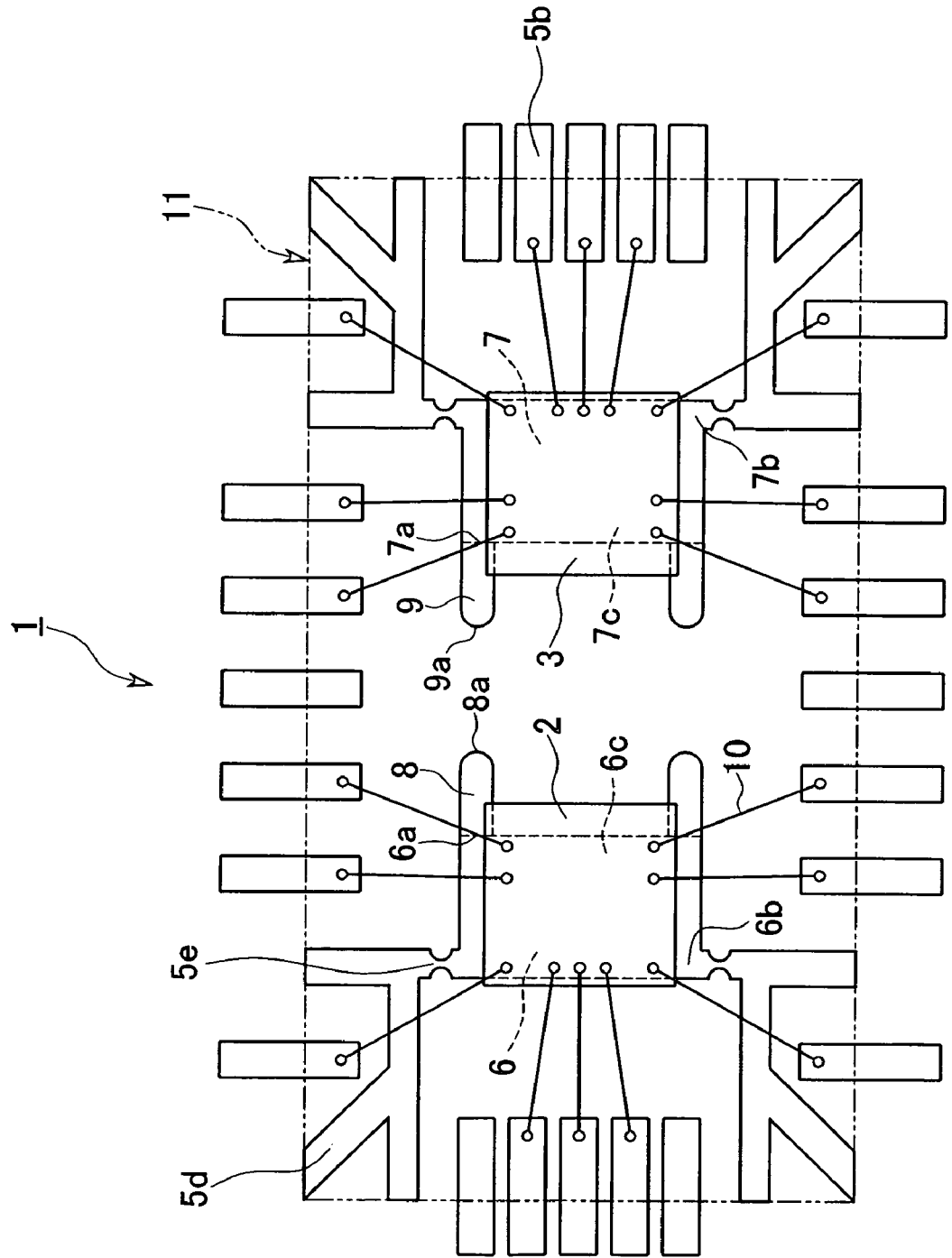
FIG. 24 is a plan view illustrating the conventional sensor for sensing a physical quantity.
Figure 25:
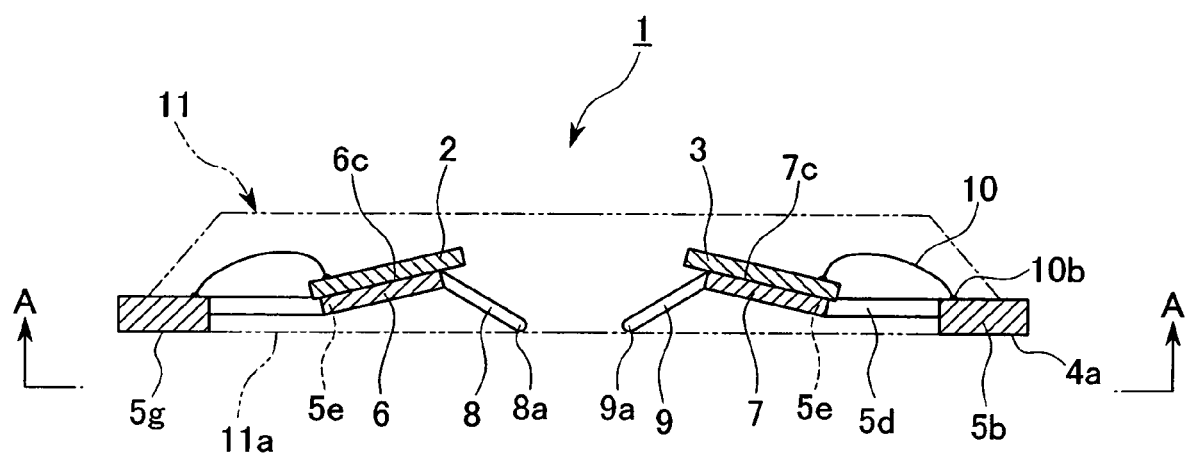
FIG. 25 is a cross sectional elevation view of the sensor of FIG. 24.

A second embodiment of the present invention will be described. The following descriptions will be directed to differences of the second embodiment from the above-described first embodiment. The second embodiment provides the sensor 1 that has the same structure as that of the first embodiment. Namely, the sensor 1 has the same structure as shown in FIGS. 1, 2 and 24-28. A method of forming the sensor 1 will be described. The lead frame 4 shown in FIG. 24 is prepared by the same manner as described in the first embodiment. FIG. 9A is a fragmentary cross sectional elevation view of the lead frame 4 in a step involved in the method of forming the sensor 1 of FIGS. 1 and 2. FIG. 9B is a fragmentary cross sectional elevation view of the lead frame 4 in another step involved in the method of forming the sensor 1 of FIGS. 1 and 2.

As shown in FIG. 9A, the lead frame 4 is interposed between first and second dies "D" and "E". The first die "D" has a concave portion and a ridge portion, while the second die "E" has a peripheral portion with a first flat surface "E1" and a protruding portion with a second flat surface "E2". The second flat surface "E2" is higher in level than the first flat surface "E1". The protruding portion has a predetermined height from the first flat surface "E1". The projecting portions 8 and 9 are positioned over the second flat surface "E2" of the protruding portion of the second die "E".

As shown in FIG. 9B, the second die "E" moves toward the first die "D", so that the second flat surface "E2" pushes up the projecting parts 8 and 9 until the first and second dies "D" and "E" sandwich the square frame portion 5a of the frame 5, whereby the twistable portions 5e are twisted, and the stages 6 and 7 are sloped or tilted from the plane that includes the frame 5. Also, the magnetic sensor chips 2 and 3 that are respectively mounted on the stages 6 and 7 are sloped or tilted together with the stages 6 and 7. The sloped magnetic sensor chips 2 and 3 have a predetermined slope angle with reference to the plane that includes the square frame portion 5a. The projecting parts 8 and 9 have the top portions 8a and 9a that tightly make contact with the second flat surface "E2" of the protruding portion of the second die "E". The leads 5b have the second surfaces 5g that tightly make contact with the first flat surface "E1" of the peripheral portion of the second die "E". The top portions 8a and 9a have a level that is higher than the second surfaces 5g of the leads 5b by the height of the protruding portion of the second die "E". The difference in level between the top portions 8a and 9a and the second surfaces 5g of the leads 5d corresponds to the height of the protruding portion of the second die "E".

A molten resin is injected into the cavity of the first and second dies "D" and "E" while the second die "E" continues to push up the projecting parts 8 and 9, thereby forming a resin mold 11 that encapsulates and fixes the sloped sensor chips 2 and 3 and the sloped stages 6 and 7. The rectangle frame portion 5a is positioned outside of the resin mold 11. Each of the leads 5b and the modified connection leads 5d has an outside portion that extends outside the resin mold 11. The leads 5 have the second surface that is shown on the second surface of the resin mold 11.

The protruding portion with the second flat surface "E2" of FIGS. 9A and 9B defines the recessed portion 11b of the resin mold 11 of FIGS. 1 and 2. The depth of the recessed portion 11b corresponds to the height of the protruding portion. The protruding portion with the second flat surface "E2" of FIGS. 9A and 9B also defines the level of the top portions 8a and 9a of the projecting parts 8 and 9. Thus, the top portions 8a and 9a are leveled to the flat surface 11c of the recessed portion 11b but have a level that is higher than the flat surface of the bottom portion 11a of the resin mold 11. The flat surface of the bottom portion 11a is leveled to the second surfaces 5g of the leads 5. Thus, the top portions 8a and 9a have a level that is higher than the flat surface of the bottom portion 11a and the second surfaces 5g of the leads 5.

The leads 5b and the modified connection leads 5d are detruncated to remove the rectangle frame portion 5a and the outside portions of the leads 5b and the modified connection leads 5d, thereby completing the sensor 1.

In accordance with the second embodiment, the first and second dies "D" and "E" are closed while the second flat surface "E2" of the protruding portion of the second die "E" pushes up the top portions 8a and 9a of the first and second projecting parts 8 and 9, whereby the stages 6 and 7 with the sensor chips 2 and 3 are sloped or tilted. The injection molding process is performed to form the resin mold 11 while the second flat surface "E2" continues to push up the top portions 8a and 9a. Thus, the top portions 8a and 9a are leveled to the flat surface 11c of the recessed portion 11b but have a level that is higher than the flat surface of the bottom portion 11a of the resin mold 11. The flat surface of the bottom portion 11a is leveled to the second surfaces 5g of the leads 5. Thus, the top portions 8a and 9a have a level that is higher than the flat surface of the bottom portion 11a and the second surfaces 5g of the leads 5. The difference in level of the top portions 8a and 9a from the second surfaces 5g of the leads 5 allows the sensor 1 to be mounted on a circuit board without causing any problems or disadvantages.

In accordance with the second embodiment, the projecting parts 8 and 9 are shaped like a slender rod. The projecting parts 8 and 9 extend from the proximal sides 6a and 7a toward the stages 7 and 6, respectively. It is possible as a modification that a plurality of the projecting parts 8 and 9 are alternatively aligned in a direction of width of the stages 6 and 7. The positions from which the projecting parts 8 and 9 extend should not be limited to the proximal sides 6a and 7a. The shape of the projecting parts 8 and 9 should not be limited to that of a slender rod.

In accordance with the second embodiment of the present invention, the modified connection lead 5d has the twistable portion 5e. It is possible as a modification of the second embodiment for the modified connection lead to have a bendable portion and a non-twistable portion. Bending the bendable portions of the modified leads 5d without twisting the non-twistable portion causes the stage to be sloped or tilted.

Third Embodiment

Figure 10A:
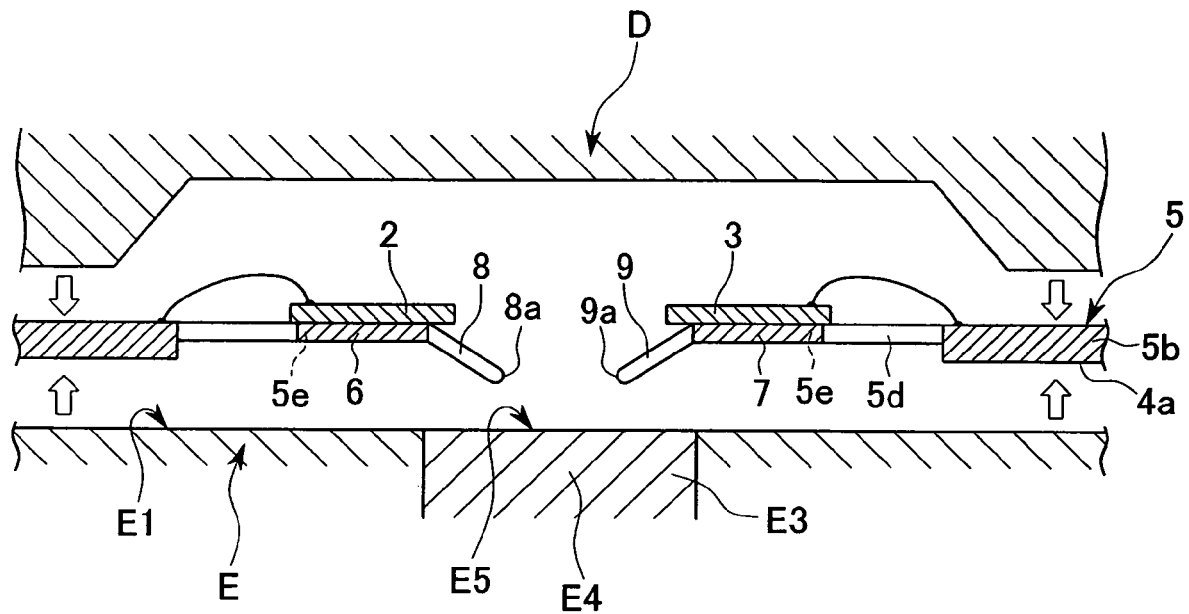
FIG. 10A is a fragmentary cross sectional elevation view of the lead frame in a step involved in the method of forming the sensor of FIGS. 1 and 2 in accordance with a third embodiment of the present invention.
Figure 10B:
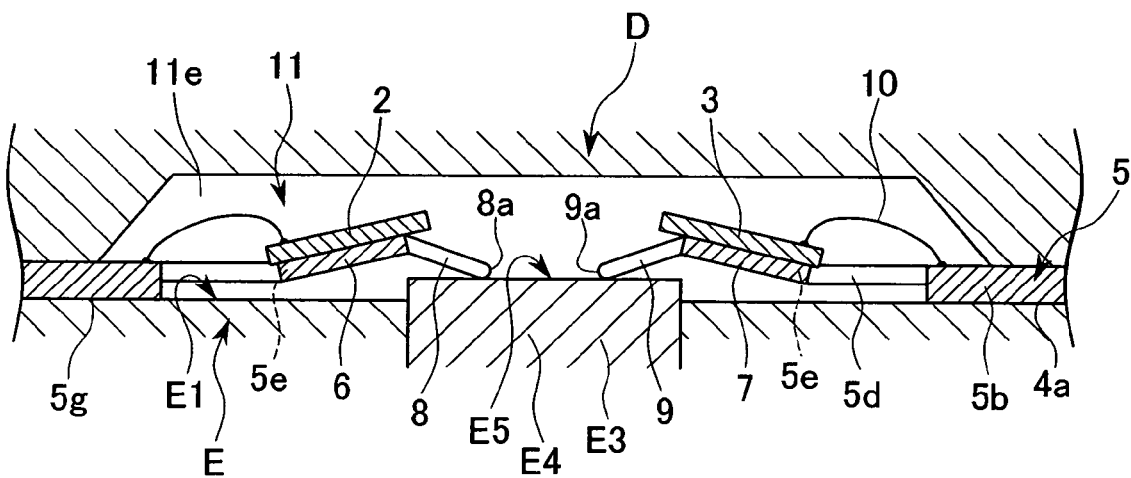
FIG. 10B is a fragmentary cross sectional elevation view of the lead frame in another step involved in the method of forming the sensor of FIGS. 1 and 2 in accordance with the third embodiment of the present invention.

A third embodiment of the present invention will be described. The following descriptions will be directed to differences of the third embodiment from the above-described first and second embodiments. The third embodiment provides the sensor 1 that has the same structure as that of the first embodiment. Namely, the sensor 1 has the same structure as shown in FIGS. 1, 2 and 24-28. A method of forming the sensor 1 will be described. The lead frame 4 shown in FIG. 26 is prepared by the same manner as described in the first embodiment. FIG. 10A is a fragmentary cross sectional elevation view of the lead frame 4 in a step involved in the method of forming the sensor 1 of FIGS. 1 and 2. FIG. 10B is a fragmentary cross sectional elevation view of the lead frame 4 in another step involved in the method of forming the sensor 1 of FIGS. 1 and 2.

As shown in FIG. 10A, the lead frame 4 is interposed between first and second dies "D" and "E". The first die "D" has a concave portion and a ridge portion, while the second die "E" has a peripheral portion with a first flat surface "E1" and an opening "E3" that accommodates an ejector pin "E4" with a second flat surface "E5". The opening "E3" has an inner wall that contacts with the ejector pin "E4" so as to allow the ejector pin "E4" to slide on the inner wall along a direction vertical to the first and second flat surfaces "E1" and "E5. The ejector pin "E4" slides between first and second positions in the opening "E3". When the ejector pin "E4" has the first position, then the second flat surface "E5" of the ejector pin "E4" is leveled to the first flat surface "E1" of the peripheral portion. When the ejector pin "E4" has the second position, then the second flat surface "E5" of the ejector pin "E4" is higher in level than the first flat surface "E1" of the peripheral portion. The projecting portions 8 and 9 are positioned over the second flat surface "E5" of the ejector pin "E4".

The second die "E" with the second flat surface "E5" that is leveled to the first flat surface "E1" moves toward the first die "D", so that the second flat surface "E5" push up the projecting parts 8 and 9 until the first and second dies "D" and "E" sandwich the square frame portion 5a of the frame 5, whereby the twistable portions 5e are twisted, and the stages 6 and 7 are sloped or tilted from the plane that includes the frame 5. Also, the magnetic sensor chips 2 and 3 that are respectively mounted on the stages 6 and 7 are sloped or tilted together with the stages 6 and 7. The sloped magnetic sensor chips 2 and 3 have a predetermined first slope angle with reference to the plane that includes the square frame portion 5a. The projecting parts 8 and 9 have the top portions 8a and 9a that tightly contact with the second flat surface "E5" that is leveled to the first flat surface "E1". The leads 5b have the second surfaces 5g that tightly contact with the first flat surface "E1" of the peripheral portion of the second die "E". The top portions 8a and 9a are leveled to the second surfaces 5g of the leads 5b.

As shown in FIG. 10B, the ejector pin "4E" moves toward the first die "D" so as to enter into the cavity defined by the first and second dies "D" and "E". The second flat surface "E5" is raised and becomes higher in level than the first flat surface "E1" while further pushing up the projecting parts 8 and 9, whereby the twistable portions 5e are further twisted, and the sloped stages 6 and 7 are further sloped or tilted. Also, the magnetic sensor chips 2 and 3 that are respectively mounted on the stages 6 and 7 are further sloped or tilted together with the stages 6 and 7. The sloped magnetic sensor chips 2 and 3 have a predetermined second slope angle that is larger than the first slope angle. The projecting parts 8 and 9 have the top portions 8a and 9a that tightly make contact with the raised second flat surface "E5" that is higher in level than the first flat surface "E1". The leads 5b have the second surfaces 5g that tightly make contact with the first flat surface "E1" of the peripheral portion of the second die "E". The top portions 8a and 9a are higher in level than the second surfaces 5g of the leads 5b. The difference in level between the top portions 8a and 9a and the second surfaces 5g of the leads 5d corresponds to the amount of movement of the ejector pin "E4".

A molten resin is injected into the cavity of the first and second dies "D" and "E" while the second flat surface "E5" of the ejector pin "E4" continues to push up the projecting parts 8 and 9, thereby forming a resin mold 11 that encapsulates and fixes the sloped sensor chips 2 and 3 and the sloped stages 6 and 7. The rectangle frame portion 5a is positioned outside of the resin mold 11. Each of the leads 5b and the modified connection leads 5d has an outside portion that extends outside the resin mold 11. The leads 5 have the second surface that is shown on the second surface of the resin mold 11.

The ejector pin "E4" with the second flat surface "E5" of FIG. 10B defines the recessed portion 11b of the resin mold 11 of FIGS. 1 and 2. The depth of the recessed portion 11b corresponds to the difference in level between the second flat surface "E5" and the first flat surface "E1". The ejector pin "E4" with the second flat surface "E5" of FIG. 10B also defines the level of the top portions 8a and 9a of the projecting parts 8 and 9. Thus, the top portions 8a and 9a are leveled to the flat surface 11c of the recessed portion 11b but have a level that is higher than the flat surface of the bottom portion 11a of the resin mold 11. The flat surface of the bottom portion 11a is leveled to the second surfaces 5g of the leads 5. Thus, the top portions 8a and 9a have a level that is higher than the second surfaces 5g of the leads 5.

The lead frame 4 with the resin mold 11 is released from the dies "D" and "E" with the ejector pin "E4". The leads 5b and the modified connection leads 5d are detruncated to remove the rectangle frame portion 5a and the outside portions of the leads 5b and the modified connection leads 5d, thereby completing the sensor 1.

In accordance with the third embodiment, after the first and second dies "D" and "E" have been closed, then the ejector pin "E4" enters into the cavity while the second flat surface "E5" further pushes up the top portions 8a and 9a of the first and second projecting parts 8 and 9, whereby the stages 6 and 7 with the sensor chips 2 and 3 are further sloped or tilted. The injection molding process is performed to form the resin mold 11 while the second flat surface "E5" continues to push up the top portions 8a and 9a. Thus, the top portions 8a and 9a are leveled to the flat surface 11c of the recessed portion 11b but have a level that is higher than the flat surface of the bottom portion 11a of the resin mold 11. The flat surface of the bottom portion 11a is leveled to the second surfaces 5g of the leads 5. Thus, the top portions 8a and 9a have a level that is higher than the second surfaces 5g of the leads 5. The difference in level of the top portions 8a and 9a from the second surfaces 5g of the leads 5 allows the sensor 1 to be mounted on a circuit board without causing any problems or disadvantages.

In accordance with the third embodiment, the projecting parts 8 and 9 are shaped like a slender rod. The projecting parts 8 and 9 extend from the proximal sides 6a and 7a toward the stages 7 and 6, respectively. It is possible as a modification that a plurality of the projecting parts 8 and 9 are alternatively aligned in a direction of width of the stages 6 and 7. The positions from which the projecting parts 8 and 9 extend should not be limited to the proximal sides 6a and 7a. The shape of the projecting parts 8 and 9 should not be limited to that of a slender rod.

In accordance with the second embodiment of the present invention, the modified connection lead 5d has the twistable portion 5e. It is possible as a modification of the third embodiment for the modified connection lead to have a bendable portion and a non-twistable portion. Bending the bendable portions of the modified leads 5d without twisting the non-twistable portion causes the stage to be sloped or tilted.

Fourth Embodiment

Figure 12:
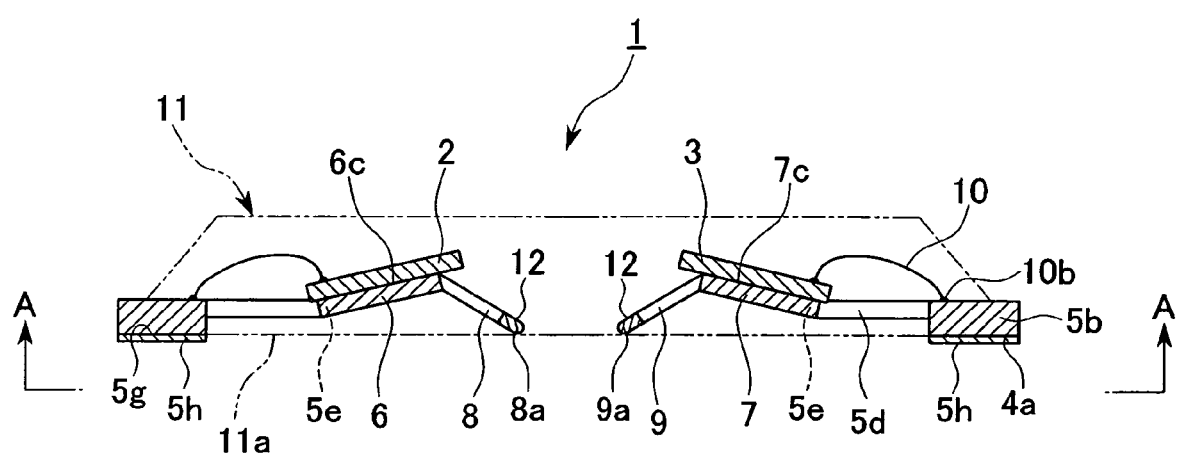
FIG. 12 is a fragmentary cross sectional elevation view illustrating a sensor for sensing a physical quantity in accordance with the fourth preferred embodiment of the present invention.
Figure 13:
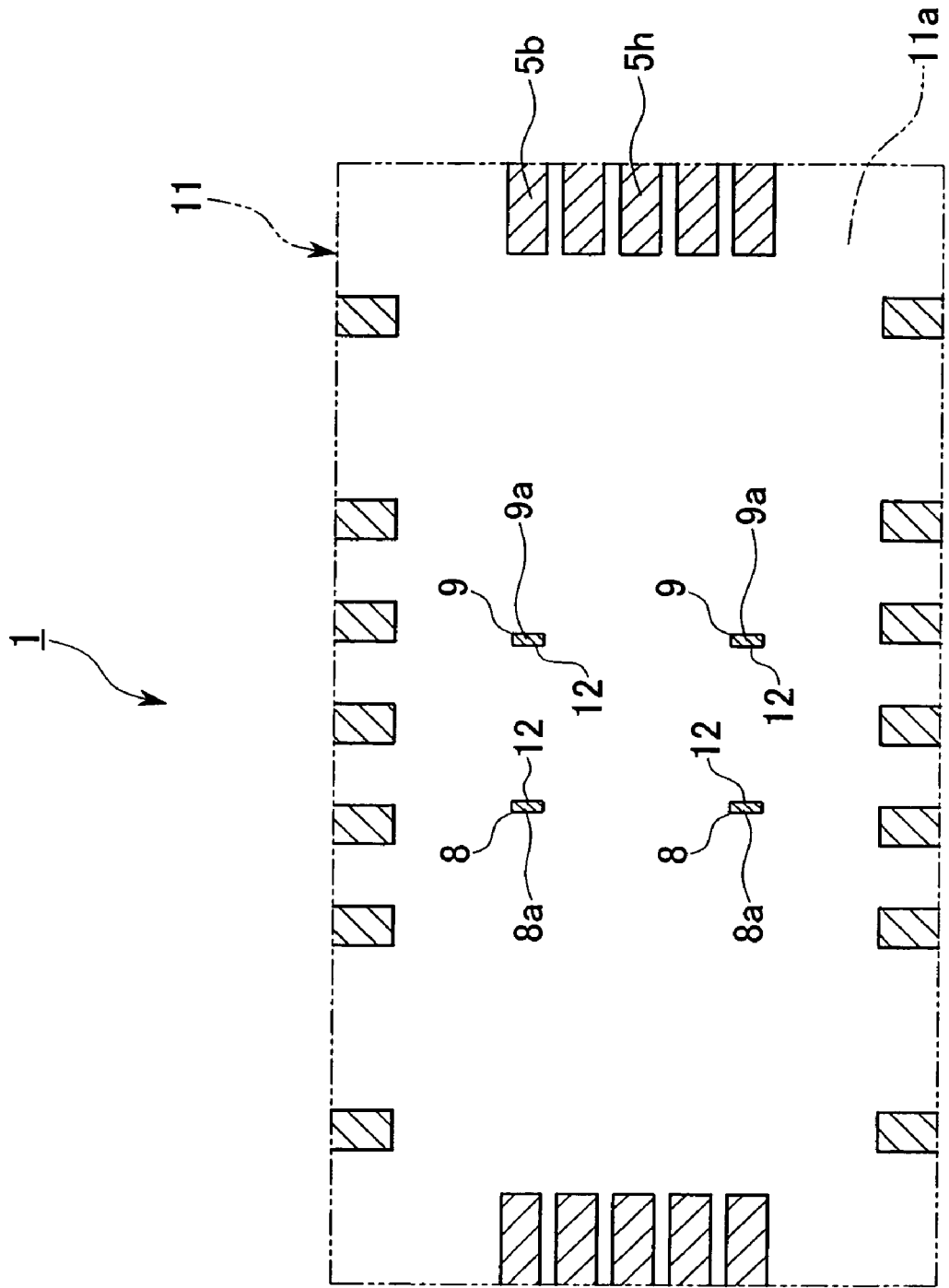
FIG. 13 is a bottom plan view of the sensor of FIGS. 11 and 12.

FIG. 11 is a fragmentary plan view illustrating a sensor for sensing a physical quantity in accordance with a fourth preferred embodiment of the present invention. FIG. 12 is a fragmentary cross sectional elevation view illustrating a sensor for sensing a physical quantity in accordance with a fourth preferred embodiment of the present invention. FIG. 13 is a bottom plan view of the sensor of FIGS. 11 and 12. The following descriptions will be directed to a difference of the sensor of the fourth embodiment from the above-described conventional sensor.

The sensor 1 includes a pair of sloped sensor chips that sense the direction and the magnitude of an external magnetic field. The sensor 1 is formed using the lead frame 4 that is shown in FIG. 26. The sensor 1 may be the type of surface mount package such as a QFN (Quad Flat Non-Leaded) package and an SON (Small Outline Non-Leaded) package.

The sensor 1 shown in FIGS. 11 and 12 includes a plurality of leads 5b, modified connection leads 5d, sloped stages 6 and 7, sensor chips 2 and 3, projecting parts 8 and 9, wirings 10, and a resin mold 11. The sloped stages 6 and 7 are supported by the modified connection leads 5d. The sensor chips 2 and 3 are mounted on the sloped stages 6 and 7, respectively. The sensor chips 2 and 3 are electrically connected through the wirings 10 to the leads 5b. The projecting parts 8 and 9 extend from the stages 6 and 7, respectively. The resin mold 11 encapsulates the leads 5b, the modified connection leads 5d, the sloped stages 6 and 7, the sensor chips 2 and 3, the projecting parts 8 and 9 and the wirings 10.

The resin mold 11 has a generally trapezoidal shape in cross section that is defined by a flat top, sloped side walls and a flat bottom.

The projecting parts 8 and 9 have top portions 8a and 9a that are coated with an insulating layer 12. A typical example of the insulating layer 12 may include, but is not limited to, an epoxy resin layer and a tetrafluoroethylene resin layer.

As shown in FIG. 12, the leads 5b have a first surface and a second surface 5g that is opposite to the first surface. The second surface 5g is coated with a plating layer 5h that can be formed by exposing the second surface 5g to an electrolytic plating solution. The plating layers 5h on the second surfaces 5g of the leads 5b are shown on the flat bottom of the resin mold 11. The insulating layers 12 that coat the top portions 8a and 9a of the projecting parts 8 and 9 are partially shown on the flat bottom of the resin mold 11.

Figure 14A:
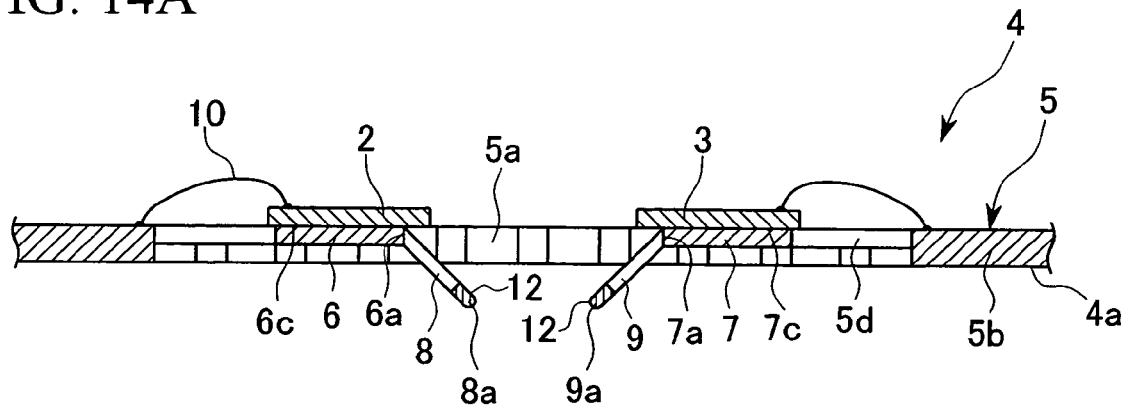
FIG. 14A is a fragmentary cross sectional elevation view of the lead frame in a step involved in the method of forming the sensor of FIGS. 11 and 12 in accordance with the fourth embodiment of the present invention.
Figure 14B:
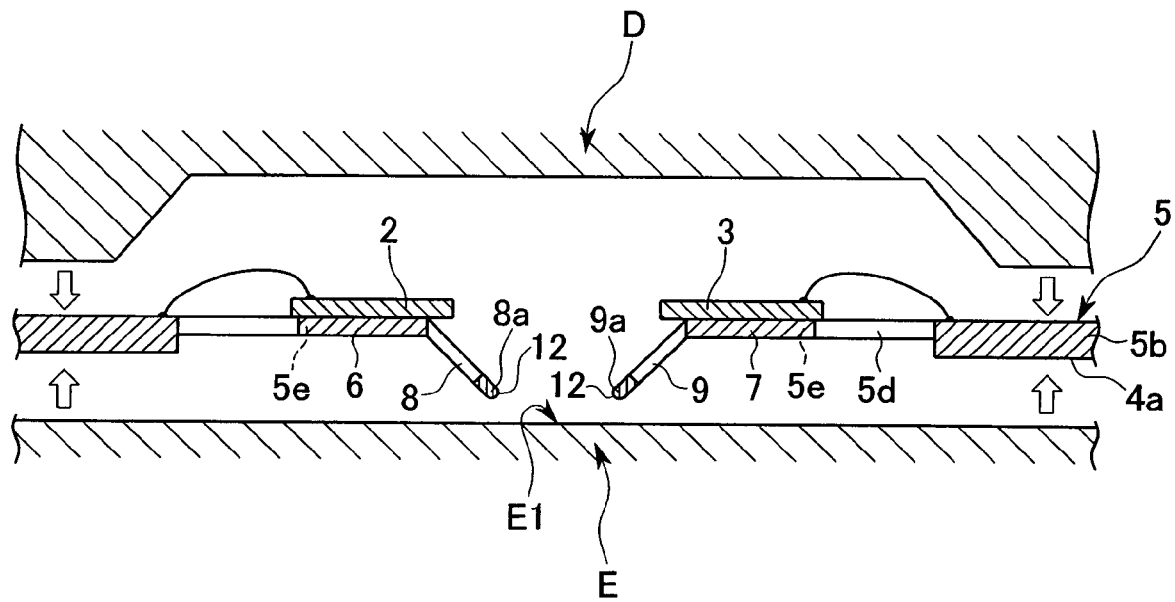
FIG. 14B is a fragmentary cross sectional elevation view of the lead frame in another step involved in the method of forming the sensor of FIGS. 11 and 12 in accordance with the fourth embodiment of the present invention.
Figure 14C:
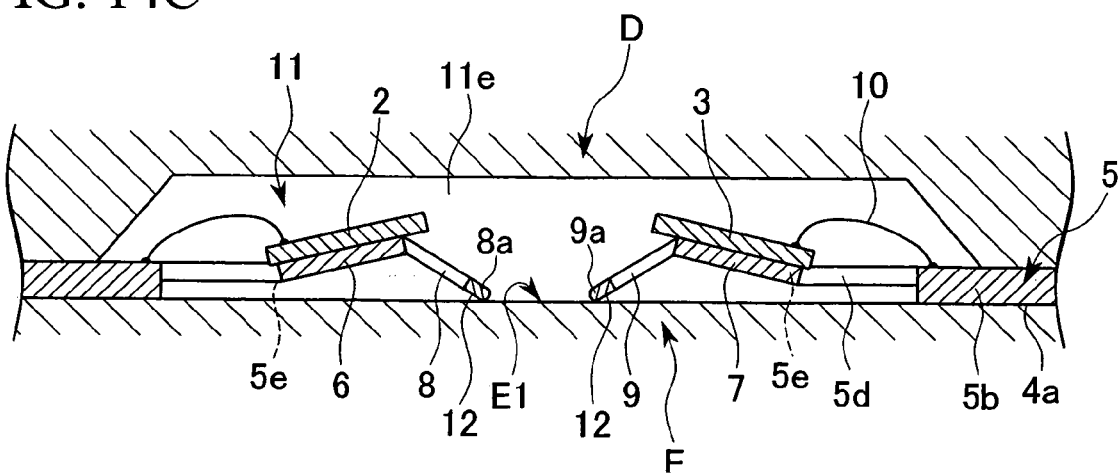
FIG. 14C is a fragmentary cross sectional elevation view of the lead frame in another step involved in the method of forming the sensor of FIGS. 11 and 12 in accordance with the fourth embodiment of the present invention.

A method of forming the above-described sensor 1 will be described. The lead frame described above with reference to FIG. 26 is prepared by the known method. FIG. 14A is a fragmentary cross sectional elevation view of the lead frame in a step involved in the method of forming the sensor of FIGS. 11 and 12 in accordance with the fourth embodiment of the present invention. FIG. 14B is a fragmentary cross sectional elevation view of the lead frame in another step involved in the method of forming the sensor of FIGS. 11 and 12 in accordance with the fourth embodiment of the present invention. FIG. 14C is a fragmentary cross sectional elevation view of the lead frame in another step involved in the method of forming the sensor of FIGS. 11 and 12 in accordance with the fourth embodiment of the present invention.

As shown in FIG. 14A, the sensor chips 2 and 3 are mounted on surfaces 6c and 7c of the stages 6 and 7, respectively. The sensor chips 2 and 3 are electrically connected through the wirings 10 to the leads 5b. An insulating material is selectively applied to the top portions 8a and 9a of the projecting parts 8 and 9 so as to form the insulating layer 12 that coats each of the top portions 8a and 9a of the projecting parts 8 and 9. The insulating material is non-conductive, such as epoxy resins or tetrafluoroethylene resins.

As shown in FIGS. 14B and 14C, the lead frame 4 is placed between paired dies "D" and "E". The die "D" has a concave portion and a ridge portion that surrounds the concave portion. The die "E" has a flat surface "E1". The die "D" moves toward the counterpart die "E" and the flat surface "E1" of the die "E" pushes the projecting parts 8 and 9, whereby the twistable portions 5e of the modified connection leads 5d are twisted and the stages 6 and 7 with the magnetic sensor chips 2 and 3 are tilted or sloped, while the top portions 8a and 9a of the projecting parts 8 and 9 still make contact tightly with the flat surface "E1".

An injection molding process is performed to inject a molten resin into a cavity 11e defined by the combined dies "D" and "E" so as to form the resin mold 11 that encapsulates the leads 5b, the modified connection leads 5d, the sloped stages 6 and 7, and the sloped sensor chips 2 and 3. The molten resin is injected into the cavity 11e so as to fill up the same while the second surfaces 5g and parts of the insulating layers 12 that coat the top portions 8a and 9a are in contact tightly with the flat surface "E1", whereby the molten resin does not cover or coat the second surfaces 5g and parts of the insulating layers 12 that coat the top portions 8a and 9a.

The lead frame 4 with the resin mold 11 is released from the dies "D" and "E". The second surfaces 5g and parts of the insulating layers 12 that coat the top portions 8a and 9a are shown on the flat bottom surface of the resin mold 11.

The lead frame 4 with the resin mold 11 is then immersed into an electrolytic plating solution to which a cathode of a DC power supply is connected, so as to form a plating layer 5h on each of the second surfaces 5g of the leads 5b. When the resin mold 11 is exposed to the electrolytic plating solution, a current flow is caused between the electrolytic plating solution and the second surfaces 5g, thereby forming the plating layer 5h on each of the second surfaces 5g of the leads 5b. The lead frame 4 except for the second surfaces 5g of the leads 5b is coated with the resin mold 11 and the insulating layers 12. The top portions 8a and 9a of the projecting parts 8 and 9 are isolated from the electrolytic plating solution by the insulating layers 12. Since the resin mold 11 and the insulating layers 12 are non-conductive, no current flow is caused between the electrolytic plating solution and the resin mold 11 or the insulating layers 12, whereby no plating layer is formed on the resin mold 11 and the insulating layers 12.

The lead frame 4 with the resin mold 11 and the plating layers 5h is picked up from the electrolytic plating solution. The leads 5b and the modified connection leads 5d have outside portions that extend outside the resin mold 11. The rectangle frame portion 5a is also positioned outside the resin mold 11. The rectangle frame portion 5a is then cut off and removed from the resin mold 11. The outside portions of the leads 5b and the modified connection leads 5d are detruncated and removed from the resin mold 11, thereby completing the sensor 1.

The sensor 1 is mounted on a circuit board so that the plating layers 5h that coat the second surfaces 5g come into contact with conductive patterns of the circuit board, while the insulating layers 12 that coat the top portions 8a and 9a are distanced from the circuit board. The absence of any plating layer on the insulating layers 12 that coat the top portions 8a and 9a of the projecting parts 8 and 9 allows the plating layers 5h on the second surfaces 5g of the leads 5b to securely make contact with conductive patterns of the circuit board, whereby the leads 5b can be electrically connected to the circuit board, and the sensor 1 can be reliably mounted on the circuit board.

In accordance with the fourth embodiment of the present invention, the insulating layers 12 that coat the top portions 8a and 9a of the projecting parts 8 and 9 are formed before the resin mold 11 is then formed, so that the lead frame 4 except for the second surfaces 5g of the leads 5b is coated with the resin mold 11 and the insulating layers 12. When the lead frame 4 with the resin mold 11 and the insulating layers 12 is immersed into the electrolytic plating solution, the lead frame 4 except for the second surfaces 5g of the leads 5b is not exposed to the electrolytic plating solution while the second surfaces 5g are exposed to the electrolytic plating solution, thereby forming the plating layers 5h on the second surfaces 5g of the leads 5b. Namely, the top portions 8a and 9a of the projecting parts 8 and 9 are isolated from the electrolytic plating solution by the insulating layers 12, whereby no plating layers are formed on the insulating layers 12 that coat the top portions 8a and 9a.

The absence of any plating layer on the insulating layers 12 allows the plating layers 5h on the second surfaces 5g of the leads 5b to securely make contact with conductive patterns of the circuit board, whereby the leads 5b can be electrically connected to the circuit board, and the sensor 1 can be satisfactorily mounted on the circuit board. The absence of any plating layer on the insulating layers 12 prevents any short circuit from being formed between the projecting parts 8 and 9 and the conductive patterns of the circuit board.

In accordance with the fourth embodiment, the insulating material with non-conductivity such as the epoxy resins and the tetrafluoroethylene resin is applied on the top portions 8a and 9a of the projecting parts 8 and 9 so as to form the insulating layers 12 that coat the top portions 8a and 9a. It is possible as a modification to adhere an insulating member having non-conductivity such as a polyimide seal or a tetrafluoroethylene seal onto the top portions 8a and 9a so as to form the insulating layers 12. It is also possible as another modification to perform a potting, dipping or coating process to apply the insulating material to the top portions 8a and 9a thereby forming the insulating layers 12. It is also possible as a modification of the fourth embodiment for the projecting parts 8 and 9 to be made of a non-conductive material such as an insulating material.

In accordance with the fourth embodiment, the insulating layers 12 are formed before the resin mold 11 is then formed. It is possible as a further modification that after the resin mold layer 11 is formed, the insulating layer 12 is formed on exposed surfaces of the top portions 8a and 9a that are shown on the bottom surface of the resin mold 11.

In accordance with the fourth embodiment, the projecting parts 8 and 9 are shaped like a slender rod. The stage 6 has a proximal side 6a to the stage 7. The stage 7 has a proximal side 7a to the stage 6. The projecting parts 8 and 9 extend from the proximal sides 6a and 7a toward the stages 7 and 6, respectively. It is possible as a modification that a plurality of the projecting parts 8 and 9 are alternatively aligned in a direction of width of the stages 6 and 7. The positions from which the projecting parts 8 and 9 extend should not be limited to the proximal sides 6a and 7a. The shape of the projecting parts 8 and 9 should not be limited to that of a slender rod.

Figure 15:
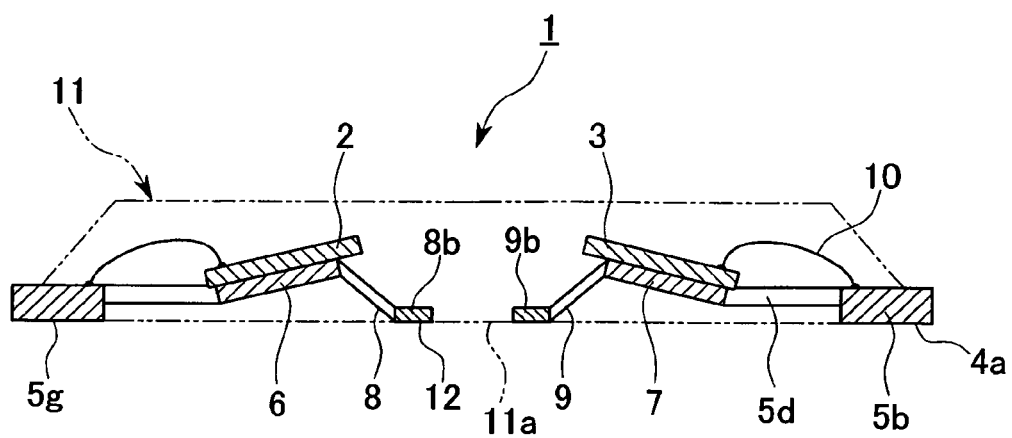
FIG. 15 is a fragmentary cross sectional elevation view illustrating a sensor for sensing a physical quantity in accordance with a modification of the fourth preferred embodiment of the present invention.

FIG. 15 is a fragmentary cross sectional elevation view illustrating a sensor for sensing a physical quantity in accordance with a modification of the fourth preferred embodiment of the present invention. As shown in FIG. 15, the projecting parts 8 and 9 have bent portions 8b and 9b that extend in parallel to the flat surface of the bottom portion 11a of the resin mold 11. The bent portions 8b and 9b are coated with the insulating layers 12. The projecting parts 8 and 9 are buried in the resin mold 11. The insulating layers 12 that coat the bent portions 8b and 9b are shown from the flat surface of the bottom portion 11a of the resin mold 11. Namely, the projecting parts 8 and 9 are coated with the resin mold 11 and the insulating layers 12. In other words, the projecting parts 8 and 9 are coated with the resin mold 11 except for the specified portions that are coated with the insulating layers 12.

Fifth Embodiment

Figure 16:
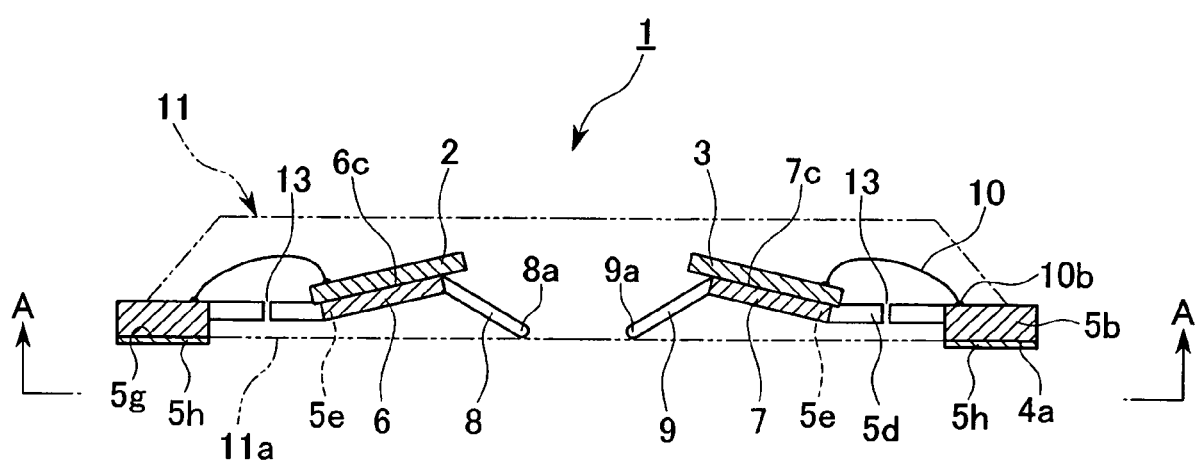
FIG. 16 is a fragmentary cross sectional elevation view illustrating a sensor for sensing a physical quantity in accordance with a fifth preferred embodiment of the present invention.
Figure 17:
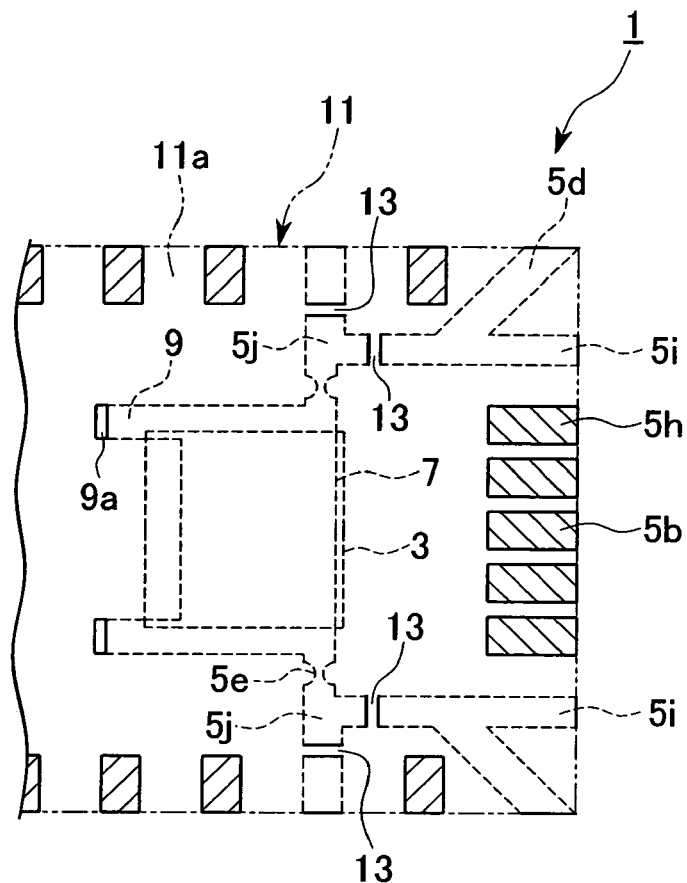
FIG. 17 is fragmentary plan view illustrating a sensor of FIG. 16.

A fifth embodiment of the present invention will be described. FIG. 16 is a fragmentary cross sectional elevation view illustrating a sensor for sensing a physical quantity in accordance with a fifth preferred embodiment of the present invention. FIG. 17 is fragmentary plan view illustrating a sensor 1 of FIG. 16. The following descriptions will be directed to differences of the fifth embodiment from the above-described fourth embodiment.

The sensor 1 shown in FIGS. 16 and 17 includes a plurality of leads 5b, modified connection leads 5d, sloped stages 6 and 7, sensor chips 2 and 3, projecting parts 8 and 9, wirings 10, and a resin mold 11. The sloped stages 6 and 7 are supported by the modified connection leads 5d. The sensor chips 2 and 3 are mounted on the sloped stages 6 and 7, respectively. The sensor chips 2 and 3 are electrically connected through the wirings 10 to the leads 5b. The projecting parts 8 and 9 extend from the stages 6 and 7, respectively. The resin mold 11 encapsulates the leads 5b, the modified connection leads 5d, the sloped stages 6 and 7, the sensor chips 2 and 3, the projecting parts 8 and 9 and the wirings 10.

Each of the leads 5b has a second surface 5g which is coated with a plating layer 5h. The projecting parts 8 and 9 are made of a conductive material such as a metal. The projecting parts 8 and 9 have top portions 8a and 9a that are exposed and shown on a bottom surface 11a of the resin mold 11. The top portions 8a and 9a of the projecting parts 8 and 9 are exposed and not coated with any insulating layer or any plating layer. Namely, the top portions 8a and 9a are free of any coating layer such as the insulating layer and the plating layer. Each of the modified connection leads 5d further comprises an inner portion 5j and an outer portion 5i that is disconnected from the inner portion 5e via one or more disconnection gaps 13. The inner portion 5j is electrically disconnected from the outer portion 5i by the disconnection gap 13. The inner portion 5j is however connected via a twistable portion 5e to the stage 6 or 7. The projecting parts 8 or 9 extend from the stage 6 or 7. The inner portions 5j of the modified connection leads 5d are electrically connected to the stage 6 or 7 and the projecting parts 8 or 9. The outer portions 5i of the modified connection leads 5d are electrically disconnected from the inner portions 5j, the stage 6 or 7 and the projecting parts 8 or 9. The outer portions 5i of the modified connection leads 5d are electrically connected to the leads 5b. The leads 5b and the outer portions 5i are electrically disconnected from the inner portions 5j, the stage 6 or 7 and the projecting parts 8 or 9.

The top portions 8a and 9a are higher in level than bottom surfaces of the plating layers 5h by a thickness of the plating layers 5h. Namely, the absence of plating layers on the top portions 8a and 9a of the projecting parts 8 and 9 makes a difference in level between the top portions 8a and 9a and the bottom surfaces of the plating layers 5h that coat the second surfaces 5g of the leads 5b. The thickness of the plating layers 5h corresponds to the level difference.

A method of forming the above-described sensor 1 will be described. The lead frame described above with reference to FIG. 26 is prepared by a known method.

The sensor chips 2 and 3 are mounted on surfaces 6c and 7c of the stages 6 and 7, respectively. The sensor chips 2 and 3 are electrically connected through the wirings 10 to the leads 5b.

Similarly to the process of the fourth embodiment described with reference to FIG. 14B, the lead frame 4 is placed between paired dies "D" and "E". The die "D" has a concave portion and a ridge portion that surrounds the concave portion. The die "E" has a flat surface "E1". The die "D" moves toward the counterpart die "E" and the flat surface "E1" of the die "E" pushes the projecting parts 8 and 9, whereby the twistable portions 5e of the modified connection leads 5d are twisted and the stages 6 and 7 with the magnetic sensor chips 2 and 3 are tilted or sloped, while the top portions 8a and 9a of the projecting parts 8 and 9 still make contact tightly with the flat surface "E1".

Similarly to the process of the fourth embodiment described with reference to FIG. 14C, an injection molding process is performed to inject a molten resin into a cavity 11e defined by the combined dies "D" and "E" so as to form the resin mold 11 that encapsulates the leads 5b, the modified connection leads 5d, the sloped stages 6 and 7, and the sloped sensor chips 2 and 3. The molten resin is injected into the cavity 11e so as to fill up the same while the second surfaces 5g and parts of the top portions 8a and 9a are in contact tightly with the flat surface "E1", whereby the molten resin does not cover or coat the second surfaces 5g and parts of the top portions 8a and 9a.

An additional process is performed to divide each of the modified connection leads 5d so that each of the modified connection leads 5d comprises the inner and outer portions 5j and 5i that are separated by the disconnection gaps 13. Typical examples of the additional process may include, but are not limited to, laser beam irradiation or sandblast. The additional process can be made from the bottom surface 11a of the resin mold 11. The leads 5b are united to the rectangle frame portion 5a. The resin mold 11 is not divided while the resin mold 11 is processed to divide the modified connection leads 5d. The projecting parts 8 and 9, the stages 6 and 7, and the inner portions 5j of the modified connection leads 5d are electrically connected to each other, but are electrically disconnected via the disconnection gaps 13 from the outer portions 5i and the leads 5b.

The lead frame 4 with the resin mold 11 is then immersed into an electrolytic plating solution to which a cathode of a DC power supply is connected, so as to form a plating layer 5h on each of the second surfaces 5g of the leads 5b. When the resin mold 11 is exposed to the electrolytic plating solution, a current flow is caused between the electrolytic plating solution and the second surfaces 5g, thereby forming the plating layer 5h on each of the second surfaces 5g of the leads 5b. The top portions 8a and 9a of the projecting parts 8 and 9 are exposed to the electrolytic plating solution. Since however the projecting parts 8 and 9, the stages 6 and 7, and the inner portions 5j of the modified connection leads 5d are electrically disconnected via the disconnection gaps 13 from the outer portions 5i and the leads 5b, no current flow is caused between the electrolytic plating solution and the top portions 8a and 9a of the projecting parts 8 and 9, whereby no plating layer is formed on the top portions 8a and 9a.

The lead frame 4 with the resin mold 11 and the plating layers 5h is picked up from the electrolytic plating solution. The leads 5b and the modified connection leads 5d have outside portions that extend outside the resin mold 11. The rectangle frame portion 5a is also positioned outside the resin mold 11. The rectangle frame portion 5a is then cut off and removed from the resin mold 11. The outside portions of the leads 5b and the modified connection leads 5d are detruncated and removed from the resin mold 31, thereby completing the sensor 1.

The sensor 1 is mounted on a circuit board so that the plating layers 5h that coat the second surfaces 5g come into contact with conductive patterns of the circuit board, while the top portions 8a and 9a of the projecting parts 8 and 9 are distanced from the circuit board. The absence of any plating layer on the top portions 8a and 9a of the projecting parts 8 and 9 allows the plating layers 5h on the second surfaces 5g of the leads 5b to securely make contact with conductive patterns of the circuit board, whereby the leads 5b can be electrically connected to the circuit board, and the sensor 1 can be reliably mounted on the circuit board.

Each of the modified connection leads 5d is divided into the inner and outer portions 5j and 5i so that the top portions 8a and 9a shown on the bottom surface 11a of the resin mold 11 are electrically floated before the lead frame 4 with the resin mold 11 is then immersed into the electrolytic plating solution. A current flow is caused between the second surfaces 5g of the leads 5b and the electrolytic plating solution while no current flow is caused between the top portions 8a and 9a and the electrolytic plating solution, whereby the plating layers 5h are formed on the second surfaces 5g of the leads 5b while the top portions 8a and 9a are not coated with any plating layer. The absence of any plating layer on the top portions 8a and 9a of the projecting parts 8 and 9 allows the plating layers 5h on the second surfaces 5g of the leads 5b to securely make contact with conductive patterns of the circuit board, whereby the leads 5b can be electrically connected to the circuit board, and the sensor 1 can be satisfactorily mounted on the circuit board.

In accordance with the fifth embodiment, each of the modified connection leads 5d is divided into the inner and outer portions 5e and 5i at a position within the resin mold 11. Namely, the disconnection gaps 13 that separate the inner portion 5j of the modified connection lead 5d from the outer portion 5i thereof are positioned within the resin mold 11. It is possible as a modification to divide the modified connection lead at another position outside the resin mold 11 so that the disconnection gaps 13 that separate the inner portion 5j of the modified connection lead 5d from the outer portion 5i thereof are positioned outside the resin mold 11. Namely, the inner portions 5j of the modified connection leads 5d extend from the inside of the resin mold 11 to the outside thereof. In this case, the dividing or disconnecting process can be performed without processing or etching the resin mold 11.

In accordance with the fifth embodiment, the dividing or disconnecting process can be performed using laser beam irradiation or sandblast. It is possible as a modification of the fifth embodiment for the dividing or disconnecting process to be performed using an etching process or a drilling process. When the modified connection leads 5d are divided at the position outside the resin mold 11, the dividing or disconnecting process can be performed by a press working. In any event, there are no limitations to the method of dividing the modified connection leads 5d.

Figure 18:
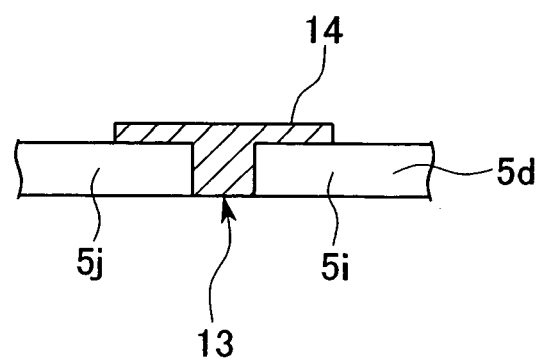
FIG. 18 is a fragmentary cross sectional elevation view illustrating a disconnection gap between the inner and outer portions of the modified connection lead in a modification of the fifth embodiment of the present invention.

In accordance with the fifth embodiment, after the resin mold 11 is formed, then the modified connection leads 5d are divided into the inner and outer portions 5j and 5i. It is possible as a further modification of the fifth embodiment for the modified connection leads 5d to be divided before the resin mold 11 is then formed. FIG. 18 is a fragmentary cross sectional elevation view illustrating the disconnection gap 13 between the inner and outer portions 5j and 5i of the modified connection lead 5d. The modified connection lead 5d is divided into the inner and outer portions 5j and 5i that are separated from each other via the disconnection gap 13. Further, an insulating member 14 having non-conductivity is formed at the disconnection gap 13 so that the insulating member 14 is interposed between the inner and outer portions 5j and 5i of the modified connection lead 5d, thereby mechanically connecting them while electrically isolating them from each other. The lead frame 4 is placed between paired dies "D" and "E". The die "D" moves toward the counterpart die "E" and the flat surface "E1" of the die "E" pushes the projecting parts 8 and 9, whereby the twistable portions 5e of the modified connection leads 5d are twisted and the stages 6 and 7 with the magnetic sensor chips 2 and 3 are tilted or sloped, while the top portions 8a and 9a of the projecting parts 8 and 9 still make contact tightly with the flat surface "E1". The insulating member 14 may advantageously have a high flexibility that allows the insulating member 14 to be bent without twisting the twistable portion 5e so as to slope or tilt the stages 8 and 9 with the sensor chips 2 and 3 while the flat surface "E1" of the die "E" pushes the projecting parts 8 and 9.

Sixth Embodiment

Figure 19:
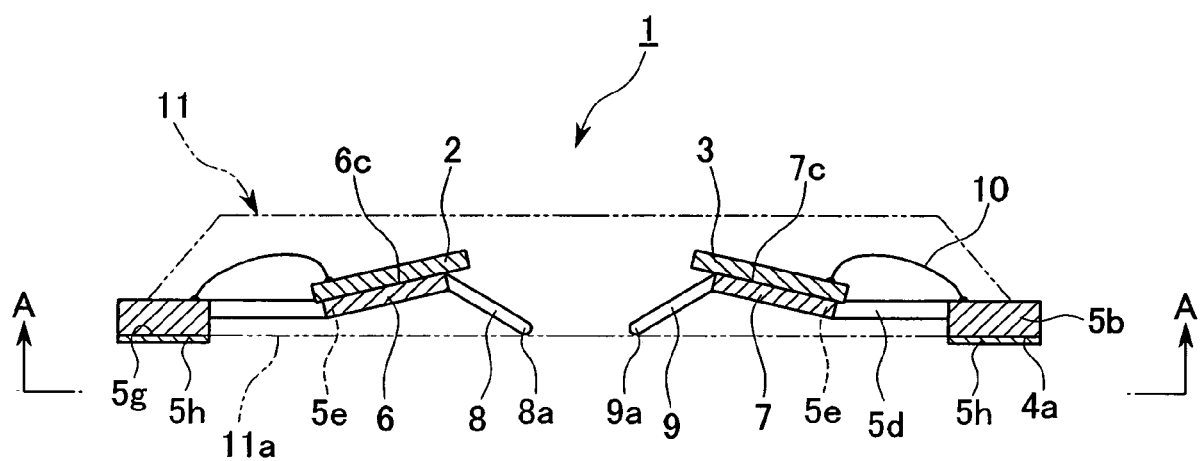
FIG. 19 is a fragmentary cross sectional elevation view illustrating a sensor for sensing a physical quantity in accordance with a sixth preferred embodiment of the present invention.
Figure 20:
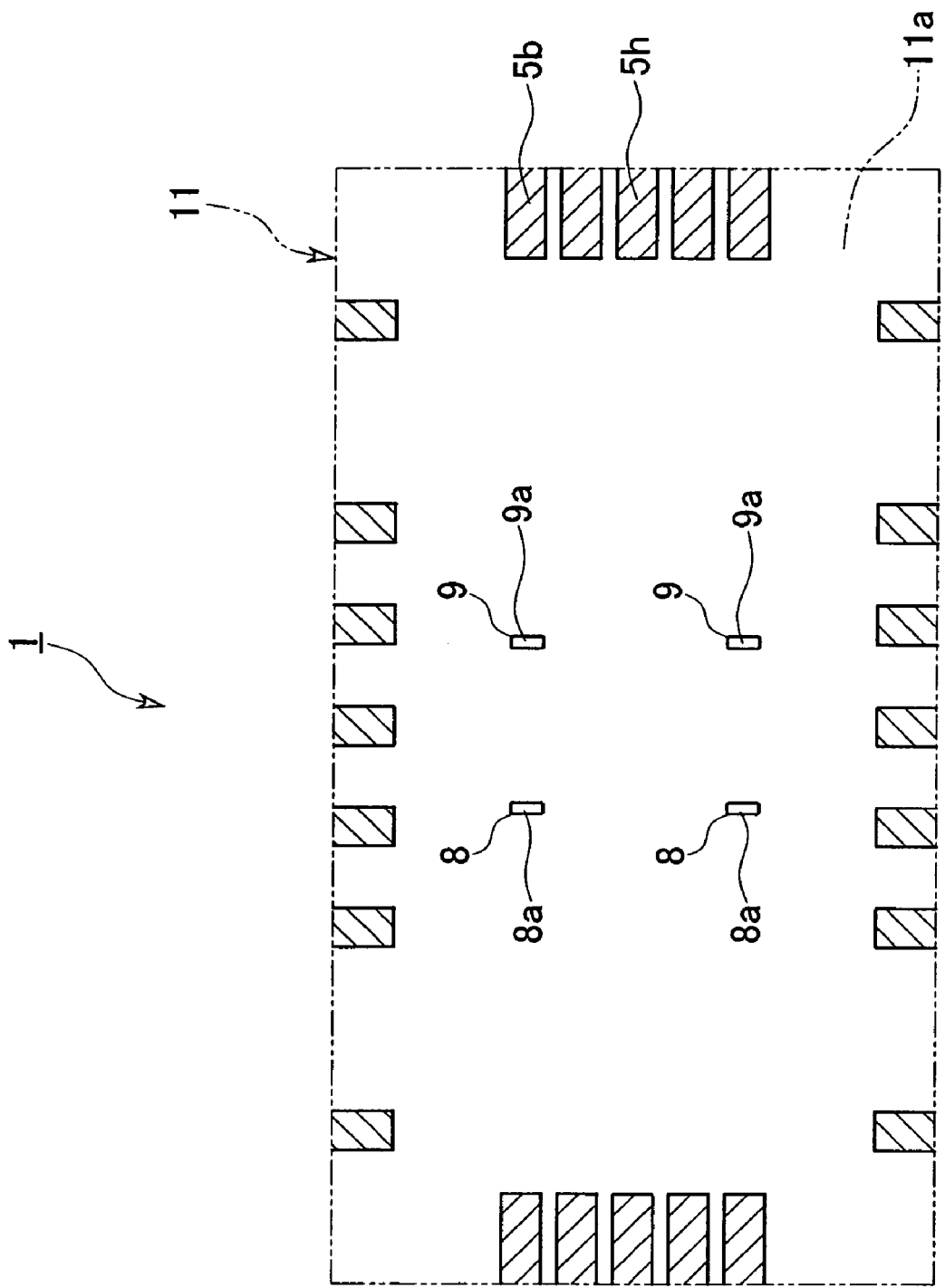
FIG. 20 is fragmentary bottom plan view illustrating a sensor of FIG. 19.
Figure 21:
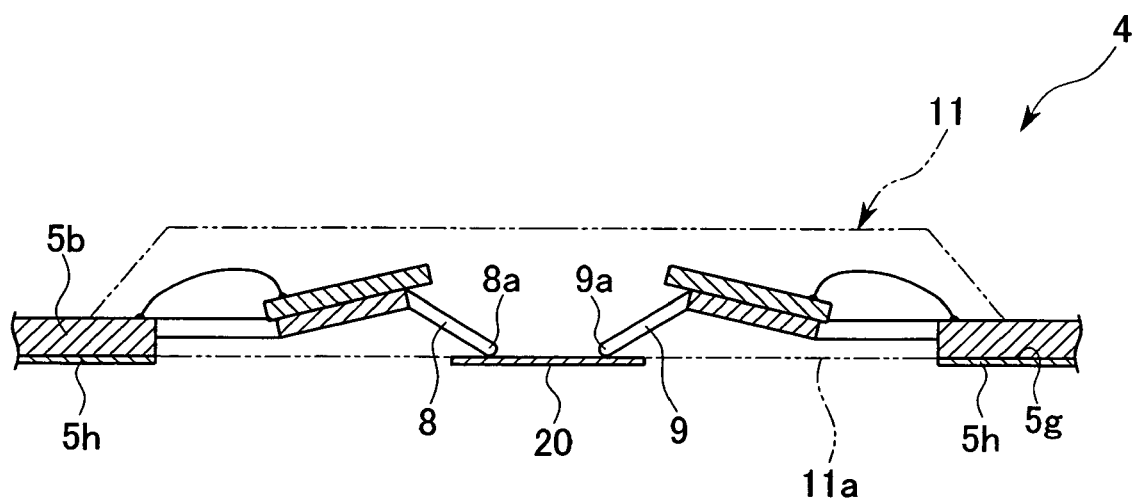
FIG. 21 is a fragmentary cross sectional elevation view of the lead frame with the resin mold in a step involved in the method of forming the sensor of FIGS. 19 and 20 in accordance with the sixth embodiment of the present invention.

A sixth embodiment of the present invention will be described. FIG. 19 is a fragmentary cross sectional elevation view illustrating a sensor for sensing a physical quantity in accordance with a sixth preferred embodiment of the present invention. FIG. 20 is fragmentary bottom plan view illustrating a sensor of FIG. 19. FIG. 21 is a fragmentary cross sectional elevation view of the lead frame with the resin mold in a step involved in the method of forming the sensor of FIGS. 19 and 20 in accordance with the sixth embodiment of the present invention. The following descriptions will be directed to differences of the sixth embodiment from the above-described fourth and fifth embodiments.

The sensor 1 shown in FIGS. 19 and 20 includes a plurality of leads 5b, modified connection leads 5d, sloped stages 6 and 7, sensor chips 2 and 3, projecting parts 8 and 9, wirings 10, and a resin mold 11. The sloped stages 6 and 7 are supported by the modified connection leads 5d. The sensor chips 2 and 3 are mounted on the sloped stages 6 and 7, respectively. The sensor chips 2 and 3 are electrically connected through the wirings 10 to the leads 5b. The projecting parts 8 and 9 extend from the stages 6 and 7, respectively. The resin mold 11 encapsulates the leads 5b, the modified connection leads 5d, the sloped stages 6 and 7, the sensor chips 2 and 3, the projecting parts 8 and 9 and the wirings 10.

Each of the leads 5b has a second surface 5g which is coated with a plating layer 5h. The projecting parts 8 and 9 are made of a conductive material such as a metal. The projecting parts 8 and 9 have top portions 8a and 9a that are exposed and shown on a bottom surface 11a of the resin mold 11. The top portions 8a and 9a of the projecting parts 8 and 9 are exposed and not coated with any insulating layer or any plating layer. Namely, the top portions 8a and 9a are free of any coating layer such as the insulating layer and the plating layer.

The top portions 8a and 9a are higher in level than bottom surfaces of the plating layers 5h by a thickness of the plating layers 5h. Namely, the absence of plating layers on the top portions 8a and 9a of the projecting parts 8 and 9 makes a difference in level between the top portions 8a and 9a and the bottom surfaces of the plating layers 5h that coat the second surfaces 5g of the leads 5b. The thickness of the plating layers 5h corresponds to the level difference.

A method of forming the above-described sensor 1 will be described. The lead frame described above with reference to FIG. 26 is prepared by a known method.

The sensor chips 2 and 3 are mounted on surfaces 6c and 7c of the stages 6 and 7, respectively. The sensor chips 2 and 3 are electrically connected through the wirings 10 to the leads 5b.

Similarly to the process of the fourth embodiment described with reference to FIG. 14B, the lead frame 4 is placed between paired dies "D" and "E". The die "D" has a concave portion and a ridge portion that surrounds the concave portion. The die "E" has a flat surface "E1". The die "D" moves toward the counterpart die "E" and the flat surface "E1" of the die "E" pushes the projecting parts 8 and 9, whereby the twistable portions 5e of the modified connection leads 5d are twisted and the stages 6 and 7 with the magnetic sensor chips 2 and 3 are tilted or sloped, while the top portions 8a and 9a of the projecting parts 8 and 9 still make contact tightly with the flat surface "E1".

Similarly to the process of the fourth embodiment described with reference to FIG. 14C, an injection molding process is performed to inject a molten resin into a cavity 11e defined by the combined dies "D" and "E" so as to form the resin mold 11 that encapsulates the leads 5b, the modified connection leads 5d, the sloped stages 6 and 7, and the sloped sensor chips 2 and 3. The molten resin is injected into the cavity 11e so as to fill up the same while the second surfaces 5g and parts of the top portions 8a and 9a are in contact tightly with the flat surface "E1", whereby the molten resin does not cover or coat the second surfaces 5g and parts of the top portions 8a and 9a.

An additional process is performed to selectively form a non-conductive seal 20 on a predetermined region of the bottom surface 11a of the resin mold 11. The predetermined region includes the top portions 8a and 9a in bottom plan view. The non-conductive seal 20 covers exposed portions of the top portions 8a and 9a of the projecting parts 8 and 9. The non-conductive seal 20 may typically be an insulating seal such as an epoxy resin seal and a tetrafluoroethylene resin seal.

The lead frame 4 with the resin mold 11 and the non-conductive seal 20 is then immersed into an electrolytic plating solution to which a cathode of a DC power supply is connected, so as to form a plating layer 5h on each of the second surfaces 5g of the leads 5b. When the resin mold 11 is exposed to the electrolytic plating solution, a current flow is caused between the electrolytic plating solution and the second surfaces 5g, thereby forming the plating layer 5h on each of the second surfaces 5g of the leads 5b. Since the top portions 8a and 9a of the projecting parts 8 and 9 are isolated from the electrolytic plating solution by the non-conductive seal 20, no current flow is caused between the electrolytic plating solution and the non-conductive seal 20 that covers the top portions 8a and 9a of the projecting parts 8 and 9, whereby no plating layer is formed on the top portions 8a and 9a.

The lead frame 4 with the resin mold 11 is picked up from the electrolytic plating solution. The non-conductive seal 20 is removed from the bottom surface 11a of the resin mold 11. The leads 5b and the modified connection leads 5d have outside portions that extend outside the resin mold 11. The rectangle frame portion 5a is also positioned outside the resin mold 11. The rectangle frame portion 5a is then cut off and removed from the resin mold 11. The outside portions of the leads 5b and the modified connection leads 5d are detruncated and removed from the resin mold 31, thereby completing the sensor 1.

The sensor 1 is mounted on a circuit board so that the plating layers 5h that coat the second surfaces 5g come into contact with conductive patterns of the circuit board, while the top portions 8a and 9a of the projecting parts 8 and 9 are distanced from the circuit board. The absence of any plating layer on the top portions 8a and 9a of the projecting parts 8 and 9 allows the plating layers 5h on the second surfaces 5g of the leads 5b to securely make contact with conductive patterns of the circuit board, whereby the leads 5b can be electrically connected to the circuit board, and the sensor 1 can be satisfactorily mounted on the circuit board. The absence of any plating layer on the top portions 8a and 9a prevents any short circuit from being formed between the projecting parts 8 and 9 and the conductive patterns of the circuit board.

In accordance with the sixth embodiment, the non-conductive seal 20 comprises the insulating material such as the epoxy resin seal and the tetrafluoroethylene resin seal. It is possible as a modification of the sixth embodiment that a conductive seal is formed which covers the top portions 8a and 9a of the projecting parts 8 and 9. When the lead frame 4 with the resin mold 11 and the conductive seal is immersed into the electrolytic plating solution, a current flow is caused between the conductive seal and the electrolytic plating solution, thereby forming a plating layer on the conductive seal. After the lead frame 4 with the resin mold 11 is picked up from the electrolytic plating solution, the conductive seal with the plating layer is removed from the bottom surface 11a of the resin mold 11. The sensor 1 is then mounted on a circuit board so that the plating layers 5h that coat the second surfaces 5g come into contact with conductive patterns of the circuit board, while the top portions 8a and 9a of the projecting parts 8 and 9 are distanced from the circuit board. The absence of any plating layer on the top portions 8a and 9a of the projecting parts 8 and 9 allows the plating layers 5h on the second surfaces 5g of the leads 5b to securely make contact with conductive patterns of the circuit board, whereby the leads 5b can be electrically connected to the circuit board, and the sensor 1 can be satisfactorily mounted on the circuit board. The absence of any plating layer on the top portions 8a and 9a prevents any short circuit from being formed between the projecting parts 8 and 9 and the conductive patterns of the circuit board.

Instead of the non-conductive seal 20, any other cover member can be used which covers the exposed portions of the top portions 8a and 9a of the projecting parts 8 and 9 when the lead frame 4 with the resin mold 11 is immersed into the electrolytic plating solution. The cover member may be a solid or liquid member that separates the top portions 8a and 9a from the electrolytic plating solution. The cover member may be formed by curing a liquid material. The cover member may be in a liquid phase.

Seventh Embodiment

Figure 22:
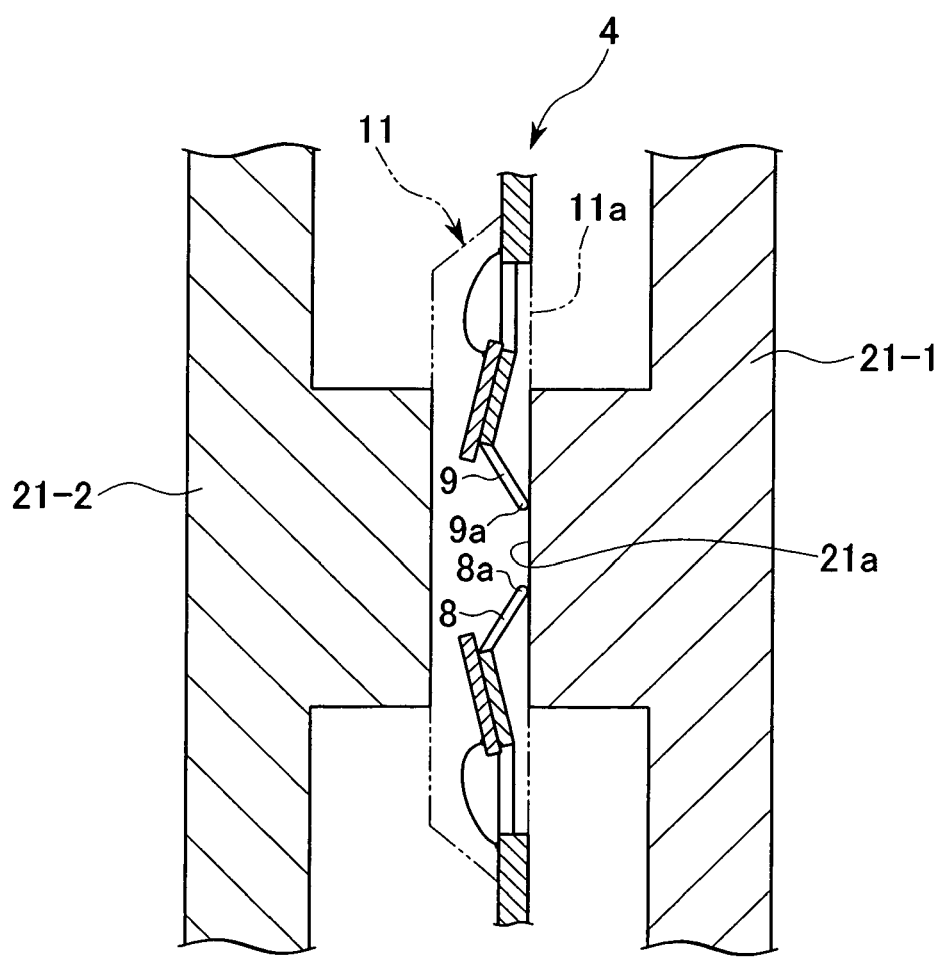
FIG. 22 is a fragmentary cross sectional elevation view of the lead frame with the resin mold in a step involved in a method of forming the sensor in accordance with a seventh embodiment of the present invention.

A seventh embodiment of the present invention will be described. FIG. 22 is a fragmentary cross sectional elevation view of the lead frame with the resin mold in a step involved in a method of forming the sensor in accordance with the seventh embodiment of the present invention. The following descriptions will be directed to differences of the sixth embodiment from the above-described fourth and fifth embodiments.

Similarly to the sixth embodiment described with reference to FIGS. 19 and 20, the sensor 1 includes a plurality of leads 5b, modified connection leads 5d, sloped stages 6 and 7, sensor chips 2 and 3, projecting parts 8 and 9, wirings 10, and a resin mold 11. The sloped stages 6 and 7 are supported by the modified connection leads 5d. The sensor chips 2 and 3 are mounted on the sloped stages 6 and 7, respectively. The sensor chips 2 and 3 are electrically connected through the wirings 10 to the leads 5b. The projecting parts 8 and 9 extend from the stages 6 and 7, respectively. The resin mold 11 encapsulates the leads 5b, the modified connection leads 5d, the sloped stages 6 and 7, the sensor chips 2 and 3, the projecting parts 8 and 9 and the wirings 10.

Each of the leads 5b has a second surface 5g which is coated with a plating layer 5h. The projecting parts 8 and 9 are made of a conductive material such as a metal. The projecting parts 8 and 9 have top portions 8a and 9a that are exposed and shown on a bottom surface 11a of the resin mold 11. The top portions 8a and 9a of the projecting parts 8 and 9 are exposed and not coated with any insulating layer or any plating layer. Namely, the top portions 8a and 9a are free of any coating layer such as the insulating layer and the plating layer.

The top portions 8a and 9a are higher in level than bottom surfaces of the plating layers 5h by a thickness of the plating layers 5h. Namely, the absence of plating layers on the top portions 8a and 9a of the projecting parts 8 and 9 makes a difference in level between the top portions 8a and 9a and the bottom surfaces of the plating layers 5h that coat the second surfaces 5g of the leads 5b. The thickness of the plating layers 5h corresponds to the level difference.

A method of forming the above-described sensor 1 will be described. The lead frame described above with reference to FIG. 26 is prepared by a known method.

The sensor chips 2 and 3 are mounted on surfaces 6c and 7c of the stages 6 and 7, respectively. The sensor chips 2 and 3 are electrically connected through the wirings 10 to the leads 5b.

Similarly to the process of the fourth embodiment described with reference to FIG. 14B, the lead frame 4 is placed between paired dies "D" and "E". The die "D" has a concave portion and a ridge portion that surrounds the concave portion. The die "E" has a flat surface "E1". The die "D" moves toward the counterpart die "E" and the flat surface "E1" of the die "E" pushes the projecting parts 8 and 9, whereby the twistable portions 5e of the modified connection leads 5d are twisted and the stages 6 and 7 with the magnetic sensor chips 2 and 3 are tilted or sloped, while the top portions 8a and 9a of the projecting parts 8 and 9 still make contact tightly with the flat surface "E1".

Similarly to the process of the fourth embodiment described with reference to FIG. 14C, an injection molding process is performed to inject a molten resin into a cavity 11e defined by the combined dies "D" and "E" so as to form the resin mold 11 that encapsulates the leads 5b, the modified connection leads 5d, the sloped stages 6 and 7, and the sloped sensor chips 2 and 3. The molten resin is injected into the cavity 11e so as to fill up the same while the second surfaces 5g and parts of the top portions 8a and 9a are in contact tightly with the flat surface "E1", whereby the molten resin does not cover or coat the second surfaces 5g and parts of the top portions 8a and 9a.

A pair of first and second jigs 21-1 and 21-2 is used to hold the lead frame 4 with the resin mold 11 and immerse the lead frame 4 with the resin mold 11 into an electrolytic plating solution to which a cathode of a DC power supply is connected. The first jig 21-1 has a first contact surface 21a that makes contact tightly with a predetermined region of the bottom surface 11a of the resin mold 11. The first contact surface 21a makes contact tightly with exposed portions of the top portions 8a and 9a of the projecting parts 8 and 9. The second jig 21-2 has a second contact surface that contacts tightly with a predetermined region of the top surface of the resin mold 11. The second surfaces 5g of the leads 5b are exposed and not covered with the first contact surface 21a of the first jig 21-1. The first and second jigs 21-1 and 21-2 may be made of an insulating material.

The first and second jigs 21-1 and 21-2 are used to hold the lead frame 4 with the resin mold 11 and immerse the same into the electrolytic plating solution, so that the second surfaces 5g of the leads 5b are exposed to the electrolytic plating solution while the top portions 8a and 9a of the projecting parts 8 and 9 are separated by the first contact surface 21a from the electrolytic plating solution. A current flow is caused between the electrolytic plating solution and the second surfaces 5g, thereby forming the plating layer 5h on each of the second surfaces 5g of the leads 5b. Since the top portions 8a and 9a of the projecting parts 8 and 9 are isolated from the electrolytic plating solution by the first contact surface 21a of the first jig 21-1, no current flow is caused between the electrolytic plating solution and the top portions 8a and 9a, whereby no plating layer is formed on the top portions 8a and 9a.

In accordance with the seventh embodiment, the lead frame 4 with the resin mold 11 is immersed into the electrolytic plating solution to expose the second surfaces 5g of the leads 5b to the electrolytic plating solution while the exposed portions of the top portions 8a and 9a of the projecting parts 8 and 9 are covered with the first contact surface 21a of the first jig 21-1 and separated from the electrolytic plating solution by the first jig 21-1. The plating layers 5h are formed on the second surfaces 5g of the leads 5b while no plating layers are formed on the top portions 8a and 9a of the projecting parts 8 and 9.

The sensor 1 is mounted on a circuit board so that the plating layers 5h that coat the second surfaces 5g come into contact with conductive patterns of the circuit board, while the top portions 8a and 9a of the projecting parts 8 and 9 are distanced from the circuit board. The absence of any plating layer on the top portions 8a and 9a of the projecting parts 8 and 9 allows the plating layers 5h on the second surfaces 5g of the leads 5b to securely make contact with conductive patterns of the circuit board, whereby the leads 5b can be electrically connected to the circuit board, and the sensor 1 can be satisfactorily mounted on the circuit board. The absence of any plating layer on the top portions 8a and 9a prevents any short circuit from being formed between the projecting parts 8 and 9 and the conductive patterns of the circuit board.

In accordance with the seventh embodiment, the lead frame 4 with the resin mold 11 is immersed into the electrolytic plating solution while the first contact surface 21a of the first jig 21-1 makes tight contact with the predetermined region of the bottom surface 11a of the resin mold 11, so as to separate the exposed surfaces of the top portions 8a and 9a of the projecting parts 8 and 9 from the electrolytic plating solution and expose the second surfaces 5g of the leads 5b to the electrolytic plating solution, thereby forming the plating layers 5h on the second surfaces 5g of the leads 5b without forming any plating layers on the exposed parts of the top portions 8a and 9a of the projecting parts 8 and 9.

Figure 23:
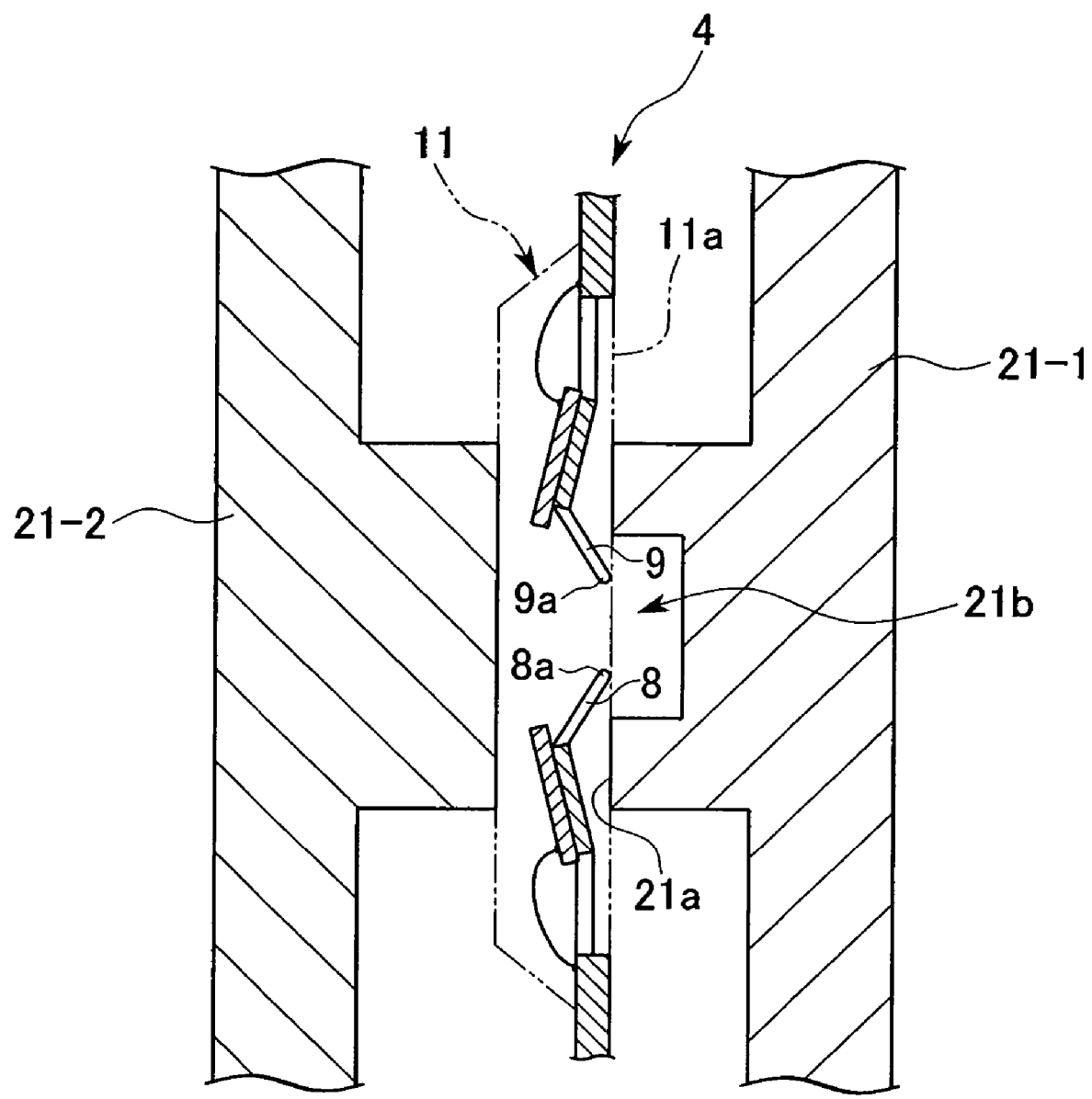
FIG. 23 is a fragmentary cross sectional elevation view of the lead frame with the resin mold in a step involved in another method of forming the sensor in accordance with the modification of the seventh embodiment of the present invention.

It is possible as a modification of the seventh embodiment for the first jig 21-1 to have a modified contact surface. FIG. 23 is a fragmentary cross sectional elevation view of the lead frame with the resin mold in a step involved in another method of forming the sensor in accordance with the modification of the seventh embodiment of the present invention. The first jig 21-1 has a first contact surface 21a that has a recess 21b. The first contact surface 21a surrounds the recess 21b in bottom plan view. The recess 21b is surrounded by a ridge that has the first contact surface 21a. The first contact surface 21a makes tight contact with a predetermined ring-shape region of the bottom surface 11a of the resin mold 11. The predetermined ring-shape region surrounds or encompasses the top portions 8a and 9a of the projecting parts 8 and 9. The recess 21b faces the top portions 8a and 9a of the projecting parts 8 and 9.

The lead frame 4 with the resin mold 11 is immersed into the electrolytic plating solution while the first contact surface 21a of the first jig 21-1 makes tight contact with the predetermined ring-shape region of the bottom surface 11a of the resin mold 11 and the top portions 8a and 9a of the projecting parts 8 and 9 face the recess 21b, so as to separate the exposed surfaces of the top portions 8a and 9a of the projecting parts 8 and 9 from the electrolytic plating solution and expose the second surfaces 5g of the leads 5b to the electrolytic plating solution, thereby forming the plating layers 5h on the second surfaces 5g of the leads 5b without forming any plating layers on the exposed parts of the top portions 8a and 9a of the projecting parts 8 and 9.

As used herein, the directional terms "up, down, inward, outward, forward, rearward, above, upward, downward, perpendicular, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "rectangle" as used herein means a shape that has four straight sides and four right angles. The term "square" as used means a shape that has four sides of the same length and four right angles. The term "oblong" means a shape that has two long sides and two short sides and four right angles. Thus, the term "rectangle" includes the term "square" and the term "oblong".

The term "physical quantity" as used herein typically means a vector quantity. The term "physical quantity" may include a scalar quantity, the vector quantity and a tensor quantity.

The terms of degree such as "generally", "substantially," "about," and "approximately" as used herein mean a reasonable amount of deviation of the modified term such that the end result is not significantly changed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a sensor, the method comprising:
    preparing a lead frame that comprises a plurality of leads that have bottom surfaces extending in a first plane, a stage that extends in a second plane that tilts from the first plane, a sensor chip that is supported on the stage, a modified connection lead structure that supports the stage, and at least one projecting part extending from the stage in a first direction that tilts from the first and second planes, the at least one projecting part having a top portion;
    forming a resin mold that encapsulates the plurality of leads, the stage, the modified connection lead structure and the at least one projecting part except for the bottom surfaces and the top portion, the resin mold further having a bottom portion with a first flat surface that is leveled to the bottom surfaces; and
    forming a recessed portion in the bottom portion, the recessed portion having a second flat surface that is higher in level than the first flat surface and is leveled to the top portion.

2. The method according to claim 1, wherein forming the recessed portion comprises selectively removing the bottom portion of the resin mold and the at least one projecting part.

3. A method of forming a sensor, the method comprising:
    preparing a lead frame that comprises a plurality of leads that have bottom surfaces extending in a first plane, a stage that extends in the first plane, a sensor chip that is supported on the stage, a modified connection lead structure that supports the stage, and at least one projecting part extending from the stage in a first direction that tilts from the first plane, the at least one projecting part having a top portion that is lower in level than the bottom surfaces; and
    moving the top portion to a first level that is higher in level than the bottom surfaces while tilting the stage from the first plane.

4. The method according to claim 3, wherein moving the top portion comprises pushing the top portion with a protruding portion of a die.

5. The method according to claim 3, wherein moving the top portion comprises pushing the top portion with an ejector pin engaged in a hole of a die.

6. A method of forming a sensor, the method comprising:
    preparing a lead frame that comprises a plurality of leads that have bottom surfaces extending in a first plane, a stage that extends in a second plane that tilts from the first plane, a sensor chip that is supported on the stage, a modified connection lead structure that supports the stage, and at least one projecting part extending from the stage in a first direction that tilts from the first and second planes, the at least one projecting part having a top portion;
    forming a resin mold that encapsulates the plurality of leads, the stage, the modified connection lead structure and the at least one projecting part except for the bottom surfaces and the top portion, the resin mold further having a bottom portion with a first flat surface that is leveled to the bottom surfaces; and
    immersing the lead frame with the resin mold into the plating solution while isolating the top portion from the plating solution with a cover member.

7. The method according to claim 6, wherein the cover member comprises an insulating layer that coats the top portion.

8. The method according to claim 6, wherein the cover member comprises a cover sheet that adheres on a predetermined region of the first flat surface of the bottom portion of the resin mold, and the predetermined region includes an exposed part of the top portion and excludes the bottom surfaces of the leads.

9. The method according to claim 6, wherein the cover member comprises a jig having a protruding portion that makes contact with a predetermined region of the first flat surface of the bottom portion of the resin mold, and the predetermined region includes an exposed part of the top portion and excludes the bottom surfaces of the leads.

10. The method according to claim 6, wherein the cover member comprises a jig that has a recess and a protruding portion surrounding the recess, the recess faces the top portion while the protruding portion contacts with a predetermined ring shape region of the first flat surface of the bottom portion of the resin mold, and the predetermined ring shape region surrounds an exposed part of the top portion while the bottom surfaces of the leads are positioned outside the predetermined ring shape region.

11. A method of forming a sensor, the method comprising:
    preparing a lead frame that comprises a plurality of leads that have bottom surfaces extending in a first plane, a stage that extends in a second plane that tilts from the first plane, a sensor chip that is supported on the stage, a modified connection lead structure that supports the stage, and at least one projecting part extending from the stage in a first direction that tilts from the first and second planes, the at least one projecting part having a top portion; and dividing the modified connection lead structure into first and second portions that are electrically disconnected from each other, the first portion being electrically connected to the at least one projecting part, the second portion being electrically connected to the plurality of leads.

12. The method according to claim 11, further comprising:
forming, before dividing the modified connection lead structure, a resin mold that encapsulates the plurality of leads, the stage, the modified connection lead structure and the at least one projecting part except for the bottom surfaces and the top portion, the resin mold further having a bottom portion with a first flat surface that is leveled to the bottom surfaces; and
exposing the bottom surfaces of the leads and the top portion of the at least one projecting part to a plating solution so as to form plating layers on the bottom surfaces without forming any plating layer on the top portion.

13. The method according to claim 11, further comprising:
forming, after dividing the modified connection lead structure, an insulating member that mechanically connects and electrically disconnects the first and second portions;
forming, after forming the insulating member, a resin mold that encapsulates the plurality of leads, the stage, the modified connection lead structure with the insulating member and the at least one projecting part except for the bottom surfaces and the top portion, the resin mold further having a bottom portion with a first flat surface that is leveled to the bottom surfaces; and
exposing the bottom surfaces of the leads and the top portion of the at least one projecting part to a plating solution so as to form plating layers on the bottom surfaces without forming any plating layer on the top portion.

14. A method of forming a sensor for sensing a physical quantity, the method comprising:
preparing a lead frame that comprises a rectangle frame portion, leads extending inwardly from the rectangle frame portion, modified connection leads extending inwardly from the rectangle frame portion, stages supported by the modified connection leads, and projecting parts that project from the stages downwardly and tilt from the stages;
securing sensor chips for sensing the physical quantity on the stages;
pushing upwardly the projecting parts so as to tilt the stages with the sensor chips from the rectangle frame portion;
forming, in a cavity, a resin mold that encapsulates the stages, the sensor chips, the projecting parts, the leads and the modified connection leads; and
positioning top portions of the projecting parts at a first level that is higher than a second level of bottom surfaces of the leads.

15. The method according to claim 14, wherein positioning top portions of the projecting parts comprises partially removing, after forming the resin mold, the projecting parts so that the projecting parts have the top portions that are positioned at the first level.

16. The method according to claim 14, wherein positioning top portions of the projecting parts comprises:
immersing, after forming the resin mold, the lead frame with the resin mold into a plating solution to form plating layers on the bottom surfaces of the leads and on the top portions of the projecting parts; and
removing the plating layers from the top portions of the projecting parts while leaving the plating layers on the bottom surfaces.

17. The method according to claim 14, wherein positioning top portions of the projecting parts comprises pushing upwardly the projecting parts with a die that has a first flat surface that makes contact with the bottom surfaces of the leads and a second flat surface that makes contact with the top portions of the projecting parts, and the second flat surface is higher in level than the first flat surface.

18. The method according to claim 14, wherein positioning the top portions of the projecting parts comprises:
pushing upwardly the projecting parts with a third flat surface of an ejector pin engaged within an opening of a die by moving the ejector pin toward the projecting parts.

19. A method of forming a sensor for sensing a physical quantity, the method comprising:
preparing a lead frame that comprises a rectangle frame portion, leads extending inwardly from the rectangle frame portion, modified connection leads extending inwardly from the rectangle frame portion, stages supported by the modified connection leads, and projecting parts that project from the stages downwardly and tilt from the stages;
securing sensor chips for sensing the physical quantity on the stages;
pushing upwardly the projecting parts so as to tilt the stages with the sensor chips from the rectangle frame portion;
forming an insulating layer on each of the top portions of the projecting parts;
forming, in a cavity, a resin mold that encapsulates the stages, the sensor chips, the projecting parts, the leads and the modified connection leads; and
immersing the lead frame with the resin mold into a plating solution so as to form plating layers on bottom surfaces of the leads without forming a plating layer on each of the top portions of the projecting parts.

20. The method according to claim 19, wherein the insulating layer on each of the top portions of the projecting parts is formed before forming the resin mold so that the projecting parts are coated with the resin mold and the insulating layers.

21. The method according to claim 19, further comprising: forming an insulating layer on each of the top portions of the projecting parts before immersing the lead frame with the resin mold into the plating solution while the projecting parts are coated with the resin mold and the insulating layers.

22. The method according to claim 19, further comprising: dividing, before immersing the lead frame with the resin mold into the plating solution, each of the modified connection leads into inner and outer portions that are separated from each other by a disconnection gap, the inner portion being connected to the projecting parts, and the outer portion being connected to the leads.

23. The method according to claim 19, further comprising: forming, after forming the resin mold, a cover member that covers exposed surfaces of the top portions of the projecting parts so that when the lead frame with the resin mold is immersed into a plating solution, the projecting parts are isolated by the resin mold and the cover member from the plating solution.

* * * * *